United States Patent [19]
Gotou et al.

[11] Patent Number: 5,623,444
[45] Date of Patent: Apr. 22, 1997

[54] ELECTRICALLY-ERASABLE ROM WITH PULSE-DRIVEN MEMORY CELL TRANSISTORS

[76] Inventors: Hiroshi Gotou; Toshifumi Asakawa, both of c/o NKK Corporation, 1-2, 1-Chome, Marunouchi, Chiyoda-Ku, Tokyo, Japan

[21] Appl. No.: 516,830

[22] Filed: Aug. 18, 1995

[30] Foreign Application Priority Data

Aug. 25, 1994 [JP] Japan ................................. 6-222734

[51] Int. Cl.$^6$ ................................................. G11C 11/34
[52] U.S. Cl. ............................ 365/185.23; 365/185.25
[58] Field of Search ..................... 365/185.23, 230.06, 365/185.08, 185.25

[56] References Cited

U.S. PATENT DOCUMENTS

| | | | |
|---|---|---|---|
| 4,282,446 | 8/1981 | McElroy | 307/238.5 |
| 4,432,072 | 2/1984 | Chao et al. | 365/185.08 |
| 4,574,273 | 3/1986 | Atsumi et al. | 365/185.23 |
| 4,649,520 | 3/1987 | Eitan | 365/185.1 |
| 4,797,856 | 1/1989 | Lee et al. | 365/185 |
| 4,931,997 | 6/1990 | Mitsuishi et al. | 365/218 |
| 4,958,317 | 9/1990 | Terada et al. | 365/104 |
| 5,068,827 | 11/1991 | Yamada et al. | 365/189.01 |
| 5,075,888 | 12/1991 | Yamauchi et al. | 365/228 |
| 5,126,808 | 6/1992 | Montalvo et al. | 357/23.5 |
| 5,126,969 | 6/1992 | Kawana | 365/149 |
| 5,132,935 | 7/1992 | Ashmore, Jr. | 365/185 |
| 5,179,536 | 1/1993 | Kasa et al. | 365/200 |
| 5,278,794 | 1/1994 | Tanaka et al. | 365/200 |
| 5,282,161 | 1/1994 | Villa | 365/185.1 |
| 5,283,758 | 2/1994 | Nakayama et al. | 365/185.13 |
| 5,307,312 | 4/1994 | Maurelli et al. | 365/182 |
| 5,327,385 | 7/1994 | Oyama | 365/218 |
| 5,402,373 | 3/1995 | Aritome et al. | 365/185 |
| 5,406,521 | 4/1995 | Hara | 365/218 |
| 5,491,656 | 2/1996 | Sawada | 365/185.29 |

FOREIGN PATENT DOCUMENTS

| | | |
|---|---|---|
| 108681A3 | 5/1984 | European Pat. Off. . |
| 53-46621 | 12/1978 | Japan . |
| 62-266793 | 11/1987 | Japan . |
| 2-166764 | 6/1990 | Japan . |
| 4-105368 | 4/1992 | Japan . |
| 4-155694 | 5/1992 | Japan . |
| 5-189988 | 7/1993 | Japan . |

OTHER PUBLICATIONS

Hiroshi Gotou, "New Operational Mode for Stacked–Gate Flash Memory Cell", IEEE Electron Device Letters, vol. 16, No. 3, Mar. 1995.

J. Kupec, et al., "Triple Level Poly Silicon E$^2$ Prom With Single Transistor Per Bit", International Electron Devices Meeting, pp. 602–606, Dec. 1980.

M. Lanzoni, et al., "A Novel Approach to Controlled Programming of Tunnel–Based Floating–Gate MOSFET's", IEEE Journal of Solid–State Circuits, vol. 29, No. 2, Feb. 1994.

*Primary Examiner*—Joseph A. Popek
*Attorney, Agent, or Firm*—Wilson Sonsini Goodrich & Rosati

[57] ABSTRACT

The drain of a memory cell transistor is connected to a sub bit line of an EEPROM. The sub bit line is connected to a main bit line via the drain-source path of a selection transistor. The equivalent capacitance of the sub bit line is precharged to the potential of the main bit line when the selection transistor is temporarily turned on. The potential of the precharged sub bit line tends to drop in the presence of a leakage current component equivalent resistance. However, when the selection transistor is intermittently turned on by using pulses to supply charges from the main bit line to the sub bit line, a drop in sub bit line potential can be prevented.

17 Claims, 13 Drawing Sheets

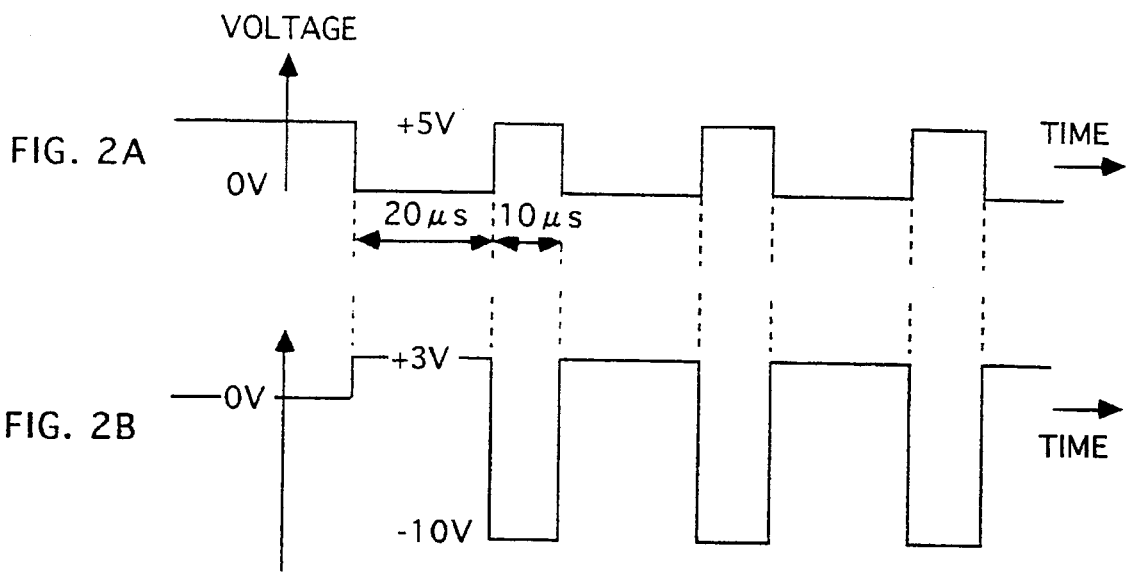
FIG. 2A
FIG. 2B
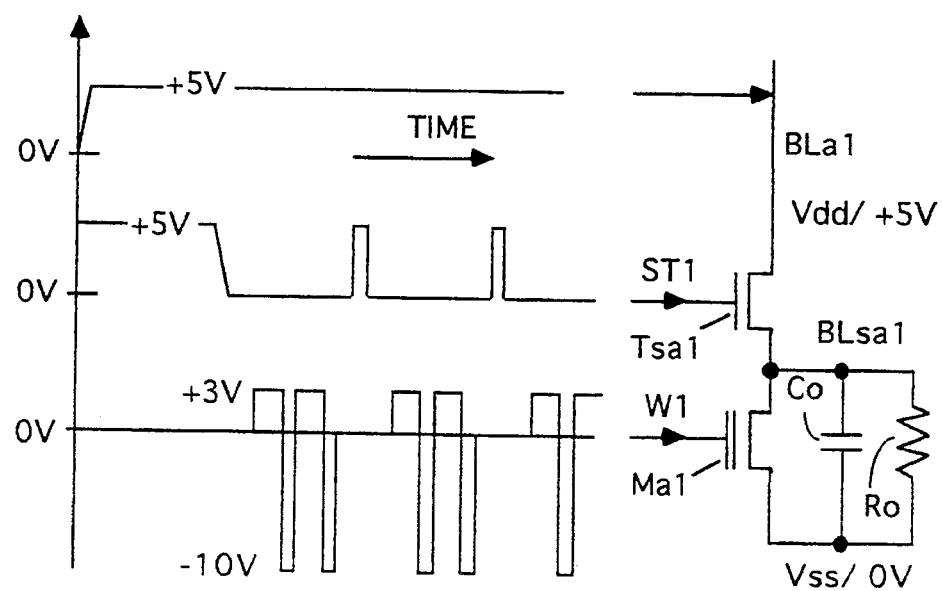
FIG. 3A          FIG. 3B

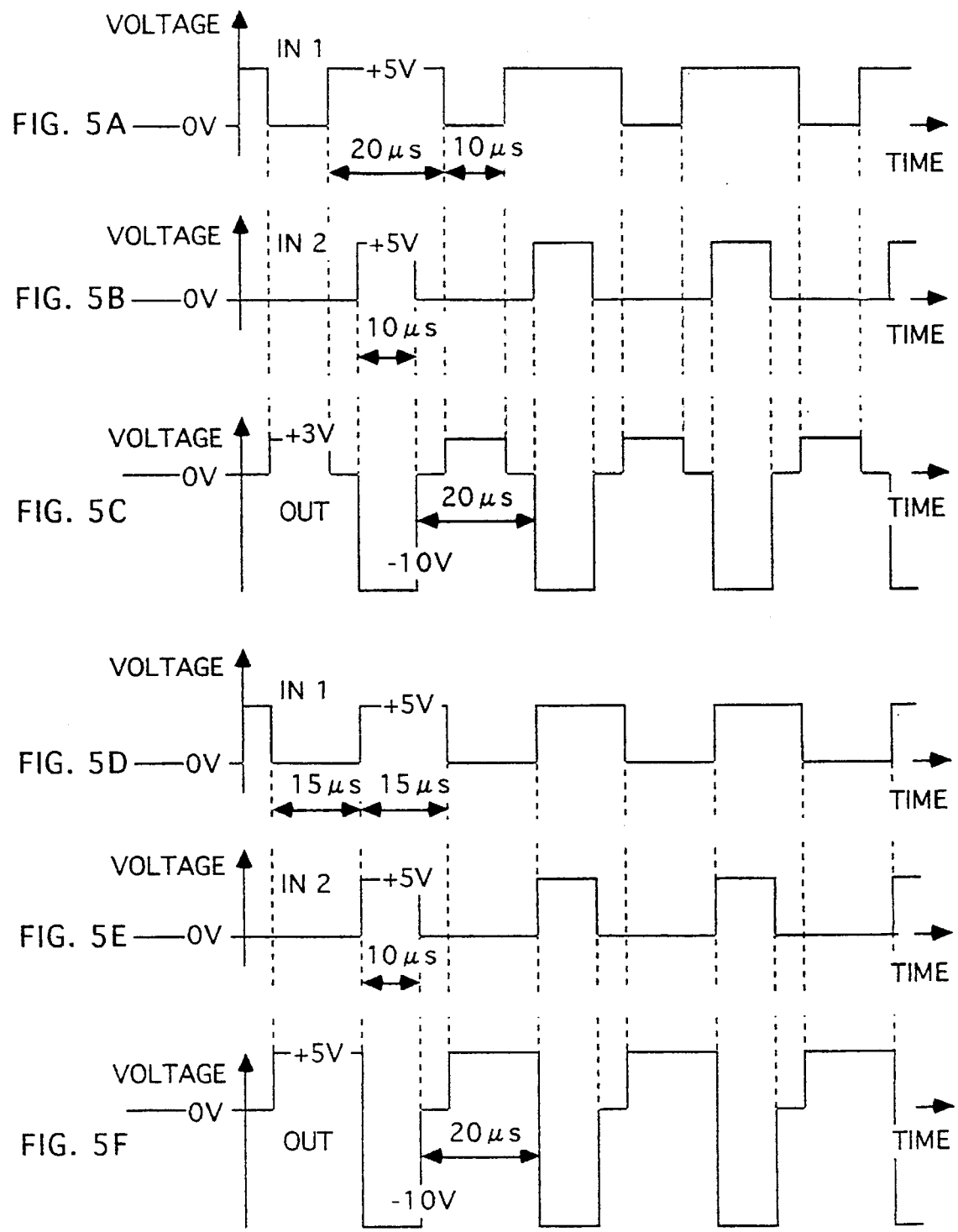

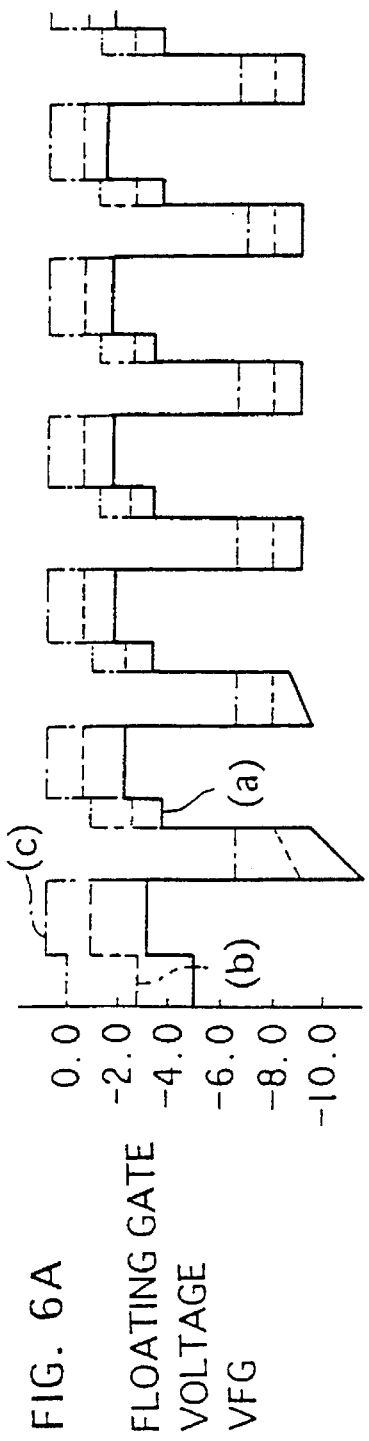
FIG. 6A FLOATING GATE VOLTAGE VFG
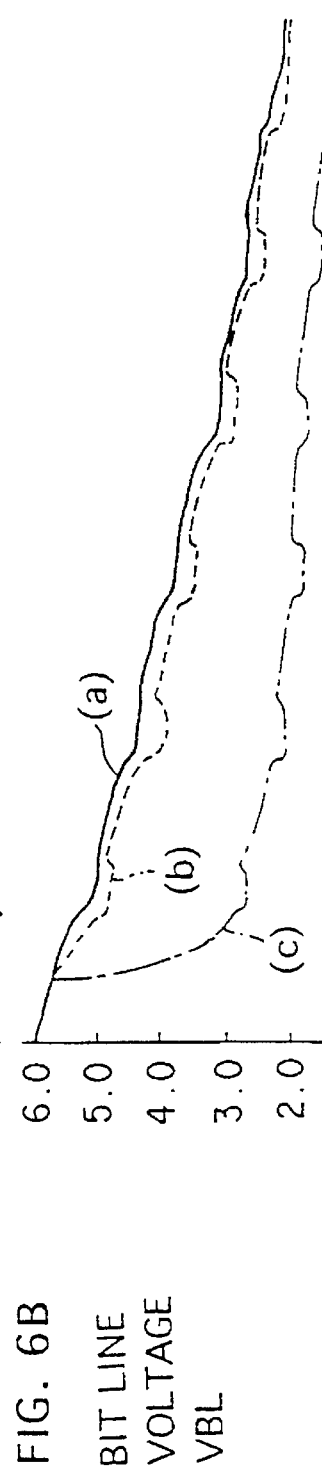
FIG. 6B BIT LINE VOLTAGE VBL
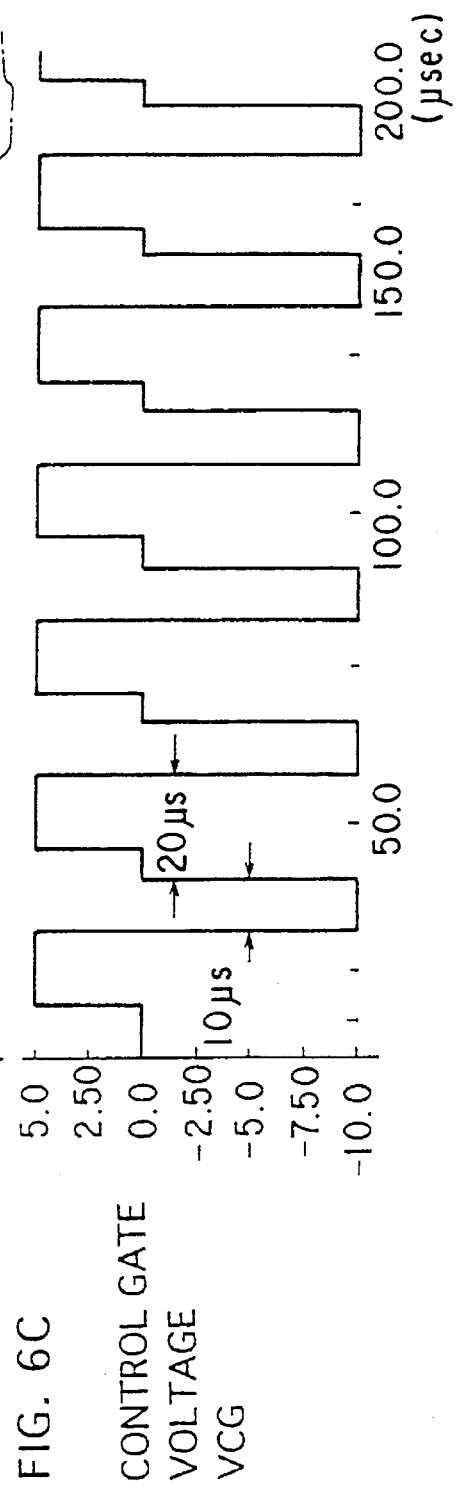
FIG. 6C CONTROL GATE VOLTAGE VCG

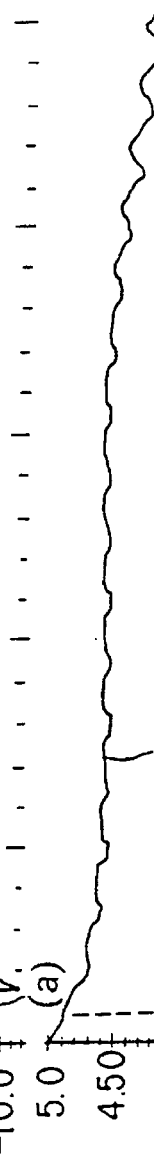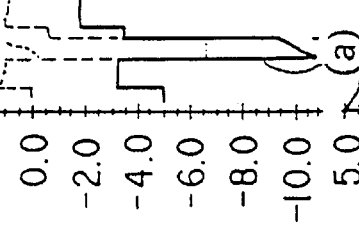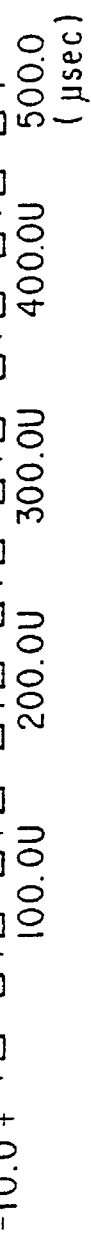
FIG. 9A FLOATING GATE VOLTAGE VFG
FIG. 9B BIT LINE VOLTAGE VBL
FIG. 9C CONTROL GATE VOLTAGE VCG

ELECTRICALLY-ERASABLE ROM WITH PULSE-DRIVEN MEMORY CELL TRANSISTORS

BACKGROUND OF THE INVENTION

1. Field of the Invention

The present invention relates to a nonvolatile semiconductor memory (EEPROM) capable of electrically rewriting/erasing information.

2. Description of the Related Art

Co-pending U.S. applications Ser. No. 08/381,944 filed on Dec. 20, 1994, and Ser. No. 08/379,480 filed on Jan. 31, 1995, are commonly invented and are exemplary of disclosures of semiconductor memory devices.

The stored information rewrite operations of nonvolatile semiconductor memories are roughly classified into operations performed by a scheme (1) of writing information with hot electrodes and erasing information with a tunnel current and operations performed by a scheme (2) of writing information with a tunnel current and erasing information with a tunnel current.

A flash EEPROM is a typical example of the nonvolatile semiconductor memory using the former scheme (1). In the flash EEPROM, information is written by applying a write voltage (high voltage Vpp) to both the control gate and drain electrode of a MOS transistor constituting a memory cell and injecting hot electrons into the floating gate.

In such an EEPROM, the threshold of a memory cell transistor changes with a change in the channel length of a MOS transistor for a memory cell, the thickness of the tunnel current passage insulating film (the thickness of the tunnel oxide film) under the floating gate, the electrode voltage between the source and the drain, or the like. As a result, the distribution (data "0") of threshold voltage VTH after information is written in each memory cell transistor greatly varies, as indicated by the hatched upper distribution in FIG. 11A or 11B.

In an erase operation, the control gate of a MOS transistor for a memory cell is grounded, and an erase voltage (Vpp) is applied to the source electrode (or the drain electrode), thereby extracting the electrons trapped in the floating gate to the source electrode (or the drain electrode) in the form of a tunnel current. In this erase operation as well, the distribution (data "1") of threshold voltage VTH of the memory cell after the information is erased is dependent on variations in the voltage (word line voltage) of the control gate, the drain voltage (or the bit line voltage), the thickness of the tunnel oxide film, or the like, and hence greatly varies, as indicated by the hatched lower distribution in FIG. 11A or 11B.

A NAND type EEPROM is a typical example of the nonvolatile semiconductor memory using the latter scheme (2). In the NAND type EEPROM, information is written or erased with a tunnel current from the floating gate of a MOS transistor constituting a memory cell.

The tunnel current used in the scheme (2) varies depending on variations in word line voltage (control gate voltage), bit line voltage (drain voltage), or the thickness of a tunnel oxide film, as in the erase operation performed by the scheme (1) described above. For this reason, in the scheme (2) as well, the distribution of threshold voltage VTH of a memory cell transistor in a write/erase operation greatly varies, as indicated by the hatched upper/lower distribution in FIG. 11C.

For example, in the case shown in FIG. 11B, of the variations in threshold voltage VTH, since variations on the upper voltage side (data "0" write operation) are distributed on the side higher than the read voltage (+5 V of TTL level) of the EEPROM, no significant problem is posed. However, since variations in threshold voltage VTH on the lower voltage side (data "1" erase operation) are distributed on the side lower than the read voltage (+5 V of TTL level) of the EEPROM, a data read operation is greatly influenced by the variations.

More specifically, if threshold voltage VTH (in particular, a threshold set after the electrons in the floating gate are extracted in an erase operation) of a memory cell transistor constituting the EEPROM greatly varies as described above, it is possible not to perform an information read operation based on a predetermined threshold voltage.

In order to prevent such an inconvenience, the write/erase time may be changed for each memory cell transistor (bit) to make threshold voltage VTH fall within a predetermined range. For this operation, however, the EEPROM requires a circuit for detecting and correcting the written/erased state of each memory cell transistor. This circuit has a complicated arrangement, and a semiconductor pellet incorporated in the EEPROM increases in area accordingly (first drawback).

In addition, if the write/erase time is changed for each bit to make the threshold voltage of each memory cell transistor fall within the predetermined range, the time required to complete a write/erase operation is prolonged with an increase in the number of bits (second drawback).

In the write/erase operation of a batch erase type flash EEPROM, in order to prevent some cells from being over-erased, the following technique is generally employed. Charges are stored first in the floating gates of a plurality of memory cell transistors in advance to write data "0" therein, and the charges stored in the floating gates of the memory cells are then removed altogether. In this technique, however, a complicated erase operation is required (third drawback).

SUMMARY OF THE INVENTION

The present invention has been made in consideration of the above situation, and has as its first object to provide a nonvolatile semiconductor memory which can suppress variations in threshold of a plurality of memory cell transistors constituting an information storage portion, and can reliably erase the information stored in the memory cell transistors without causing an over-erased state.

It is the second object of the present invention to provide a nonvolatile semiconductor memory which can reliably write information in each memory cell transistor and can shorten the time required for an information write operation.

In a nonvolatile semiconductor memory of the present invention associated with the first object, a word line drive signal (WDP) unique to the present invention is supplied to a word line to which the control gate of a memory cell transistor is connected. This word line drive signal (WDP) has an oscillating waveform (AC waveform). More specifically, the potential of this signal alternately and repeatedly oscillates a predetermined number of times (e.g., 10 times) between one potential (e.g., +3 V) corresponding to a desired threshold (e.g., +2.5 V) for a target memory cell transistor and the other potential (e.g., −10 V) for extracting charges stored in the floating gate of the target memory cell transistor (Ma1) in the form of a tunnel current. In this case, the absolute value of the other potential (−10 V) of the word line drive signal (WDP) is set to be several times (about two to five times) the absolute value of one potential (+3 V). The ratio of the other potential to one potential is properly determined in accordance with each embodiment of the present invention. In addition, the number of times the word line drive signal (WDP) oscillates is properly determined in accordance with each embodiment. Furthermore, the AC waveform of the word line drive signal (WDP) is not limited to a specific shape such as a rectangular shape, and signals having various waveforms such as a sine wave, a triangular wave, and a sawtooth wave can be used as word line drive signals (WDP).

A nonvolatile semiconductor memory according to the second object of the present invention includes a means for holding charges of write information in a bit line for transmitting write information to a memory cell transistor, and uses this charge holding means as a write buffer.

Another nonvolatile semiconductor memory according to the second object of the present invention includes a means for holding charges of write information in a bit line for transmitting write information to a memory cell transistor, and a means for compensating for a leakage component when the charges held in the charge holding means leak, and uses the charge-leakage-compensated charge holding means as a write buffer.

In the nonvolatile semiconductor memory according to the first object of the present invention, one potential (+3 V) of the word line drive signal (WDP) is applied to the control gate of a target memory cell transistor (Ma1), and it is then checked whether the memory cell transistor is turned on by one potential (+3 V).

If the target memory cell transistor is turned on, the bit line potential drops through the drain-source path of the transistor. Thereafter, even if the other potential (−10 V) of the word line drive signal (WDP) is applied to the control gate of the memory cell transistor, no charges are removed from the floating gate of the transistor in the form of a tunnel current (prevention of an over-erased state).

If the memory cell transistor is not turned on (the threshold of the target memory cell transistor is higher than a desired value) by one potential (+3 V) of the initial word line drive signal (WDP), no drop in bit line potential occurs. When the other potential (−10 V) of the word line drive signal (WDP) is applied to the control gate immediately after the above operation, a small amount of stored charge is extracted from the floating gate of the target memory cell transistor in the form of a tunnel current. As a result, the threshold of the target memory cell transistor drops by the amount corresponding to the extracted charges.

When the memory cell transistor is not turned on (the threshold of the target memory cell transistor is higher than the desired value) even after one potential (+3 V) of the word line drive signal (WDP) is applied to the memory cell transistor whose threshold has dropped to some degree, no drop in bit line potential occurs. When the other potential (−10 V) of the word line drive signal (WDP) is applied to the control gate immediate after the above operation, stored charges are extracted from the floating gate of the target memory cell transistor again in the form of a tunnel current. As a result, the threshold of the target memory cell transistor further drops by the amount corresponding to the extracted charges.

If the memory cell transistor is turned on (i.e., the threshold of the target memory cell transistor drops to the desired value) after one potential (+3 V) of the word line drive signal (WDP) is applied to the memory cell transistor whose threshold has dropped further, the bit potential drops through the drain-source path of the target memory cell transistor in an ON state. Thereafter, even if the other potential (−10 V) of the word line drive signal (WDP) is applied to the control gate of the memory cell transistor, no charges are removed from the flowing gate in the form of a tunnel current (prevention of an over-erased state). At this time, the target memory cell transistor has undergone an erase operation to be accurately set to a desired threshold without causing an over-erased state (achievement of the first object).

According to the present invention, since all the thresholds of many memory cell transistors constituting a nonvolatile semiconductor memory can be caused to converge to a desired value (+2.5 V) corresponding to one potential (+3 V) of the word line drive signal (WDP), the width of variations in threshold of the respective memory cell transistors is very small (⅓ or less that in the prior art).

In the nonvolatile semiconductor memory according to the second object of the present invention, charges of information to be written in a memory cell transistor are temporarily held in the capacitance component on the bit line (a high-speed bit line capacitance charging operation), and the held information charges (bit line voltage) are injected (written/stored) into the floating gate of the target memory cell transistor in the form of hot electrons. The latter operation, however, takes a longer time than the bit line capacitance charging operation. A write buffer operation, i.e., causing the capacitance component on a bit line to temporarily hold write charge information (high-speed bit line capacitance charging operation), can be performed at a relatively high speed similar to a normal data write operation with respect to a DRAM (Dynamic Random Access memory). For this reason, an information write operation with respect to a memory cell transistor is completed within a short period of time when the write operation is viewed from the outside of the memory (EEPROM) (achievement of the second object).

In another nonvolatile semiconductor memory according to the second object of the present invention, charges of information to be written in a memory cell transistor are temporarily held in the capacitance component on the bit line, and the held information charges are injected into the floating gate of the target memory cell transistor. Even if a leakage current flows in the bit line to make the bit line potential drop, this drop in bit line potential is prevented by a leakage compensation means. For this reason, even if a leakage current flows in the bit line, no drop in bit line potential occurs, and the charge information (voltage information held in the bit line capacitor at a high speed by an operation similar to a DRAM operation) can be held for a long period of time. Therefore, this charge information can be reliably written in the floating gate of the target memory cell transistor (achievement of the second object).

BRIEF DESCRIPTION OF THE DRAWINGS

FIG. 2A is a timing chart showing the waveform of an input signal to a word line drive pulse generator used in the apparatus in FIG. 1;

FIG. 2B is a timing chart showing the waveform of an output signal from the word line drive pulse generator used in the apparatus in FIG. 1;

FIG. 3A is a timing chart showing the waveforms of voltages used in the main part of the apparatus in FIG. 1 to explain the circuit operations of a bit line selection transistor and a memory cell transistor;

FIG. 3B is an equivalent circuit diagram based on a capacitance component on the bit line and a leakage current component in the apparatus in FIG. 1 to explain the circuit operations of the bit line selection transistor and the memory cell transistor;

FIGS. 5A to 5F are timing charts for explaining the circuit operation of a word line drive pulse generator used in the apparatus in FIG. 4, in which FIG. 5A shows the first input signal waveform in the first example, FIG. 5B shows the second input signal waveform in the first example, FIG. 5C shows an output pulse waveform in the first example, FIG. 5D shows the first input signal waveform in the second example, FIG. 5E shows the second input signal waveform in the second example, and FIG. 5F shows an output pulse waveform in the second example;

FIGS. 6A to 6C are timing charts for explaining the operations of memory cells constituting the nonvolatile semiconductor memory in FIG. 4 in a case wherein the word line drive pulse generator in FIG. 4 is operated according to the waveforms shown in FIGS. 5D to 5F, in which FIG. 6A shows an example of the voltage waveform at the floating gate of a MOS transistor constituting each memory cell, FIG. 6B shows an example of the voltage change at the bit line to which the MOS transistor is connected, and FIG. 6C shows an example of the voltage waveform at the control gate of the MOS transistor;

FIGS. 9A to 9C are timing charts for explaining the operations of memory cells constituting the nonvolatile semiconductor memory in FIG. 8A, in which FIG. 9A shows an example of the voltage waveform at the floating gate of a MOS transistor constituting each memory cell, FIG. 9B shows an example of the voltage change at the bit line to which the MOS transistor is connected, and FIG. 9C shows an example of the voltage waveform at the control gate of the MOS transistor;

FIGS. 11A to 11C are views for explaining conventional EEPROM cell structures and their threshold distributions, in which FIG. 11A shows an example of the threshold distribution of an offset gate type flash EEPROM, FIG. 11B shows an example of the threshold distribution of a self align type flash EEPROM, and FIG. 11C shows an example of the threshold distribution of a NAND type flash EEPROM;

DETAILED DESCRIPTION OF THE PREFERRED EMBODIMENTS

The arrangement and operation of a nonvolatile semiconductor memory (EEPROM) of the present invention will be described below with reference to the accompanying drawings.

Figure 1:
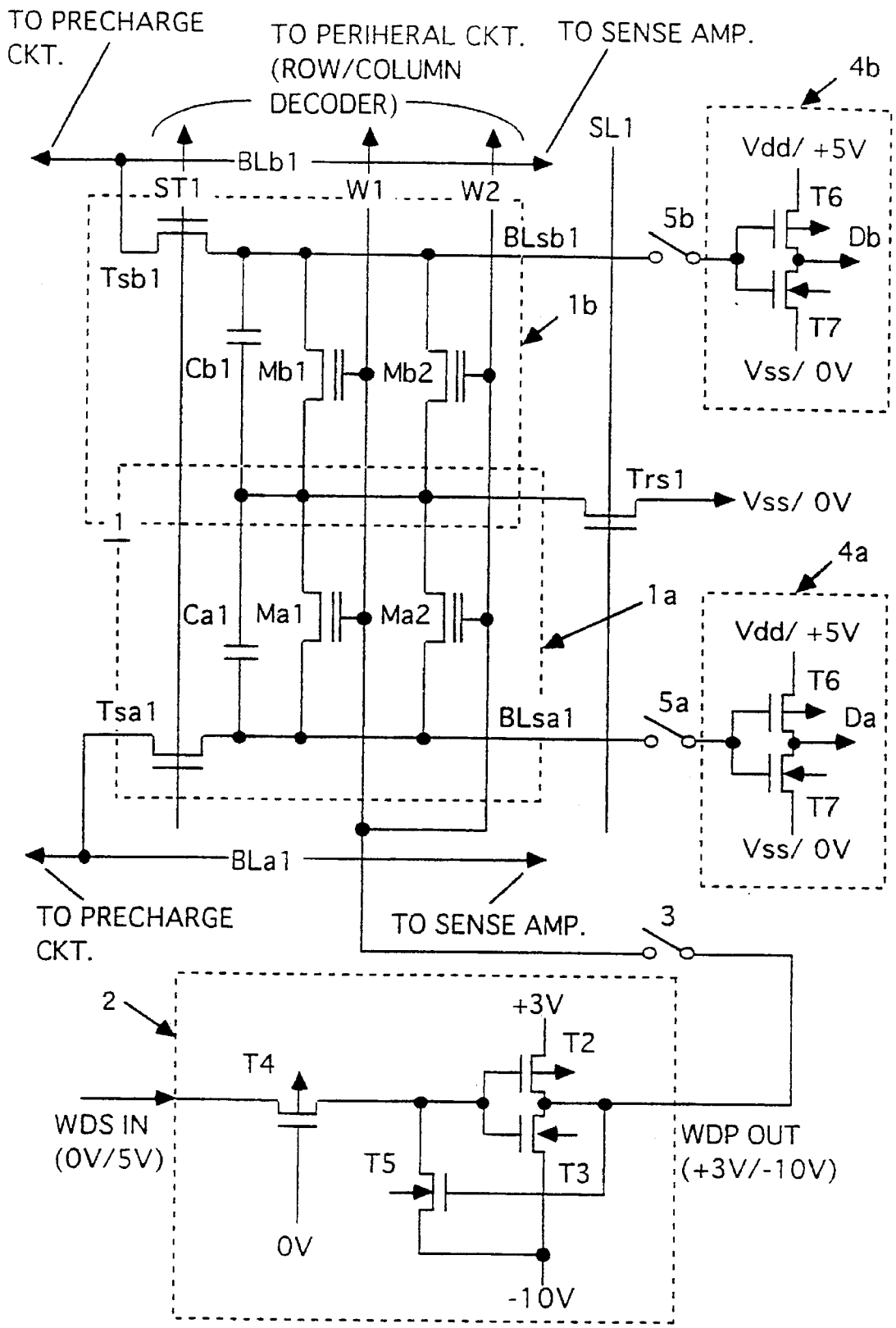
FIG. 1 is a circuit diagram for explaining the arrangement of a nonvolatile semiconductor memory according to an embodiment of the present invention.

FIG. 1 is a circuit diagram showing the main part of an EEPROM according to an embodiment of the present invention. Referring to FIG. 1, memory cell array 1 includes bit line selection transistor Tsa1 for selectively connecting main bit line BLa1 to sub bit line BLsa1, nonvolatile memory cell transistors Ma1 and Ma2 whose drains are connected to sub bit line BLsa1, and bit line capacitor Ca1 connected between sub bit line BLsa1 and a common source circuit for nonvolatile memory cell transistors Ma1 and Ma2. Each of nonvolatile memory cell transistors Ma1 and Ma2 has an n-channel MOS transistor structure having a control gate and a floating gate. Nonvolatile charge information is held in the floating gate of each nonvolatile memory cell transistor.

In this case, a sub bit line is a conductive line connected to the drain (or source) of a memory cell transistor, and a main bit line is a conductive line connected to a sub bit line via a switch means.

Memory cell array 1 further includes bit line selection transistor Tsb1 for selectively connecting main bit line BLb1 to sub bit line BLsb1, nonvolatile memory cell transistors Mb1 and Mb2 whose drains are connected to sub bit line BLsb1, and bit line capacitor Cb1 connected between sub bit line BLsb1 and a common source circuit for nonvolatile memory cell transistors Mb1 and Mb2. Each of nonvolatile memory cell transistors Mb1 and Mb2 has a control gate and a floating gate. Nonvolatile charge information is held in the floating gate of each nonvolatile memory cell transistor.

The common source circuits for memory cell transistors Ma1, Ma2, Mb1, and Mb2 are selectively connected to a ground circuit (or a negative power supply Vss/0 V circuit) via source-side selection transistor Trs1.

Bit line selection gate line ST1 is connected to the gates of bit line selection transistors Tsa1 and Tsb1, and source-side selection gate line SL1 is connected to the gate of source-side selection transistor Trs1. Word line W1 is connected to the gates of memory cell transistors Ma1 and Mb1, and word line W2 is connected to the gates of memory cell transistors Ma2 and Mb2.

The arrangement of each of the memory cell transistors (Ma1 to Ma2/Mb1 to Mb2) will be described in detail.

The floating gate has a size of 3 μm×1 μm and is in contact with portions of the channel and the source/drain through the gate oxide film.

The channel has a size of 1 μm×1 μm. The gate oxide film has a thickness of 10 nm.

The insulating film between the floating gate and the control gate is constituted by an ONO film (silicon oxide film/silicon nitride film/silicon oxide film) having a thickness of 15 nm figured out as the thickness of the silicon oxide film.

Bit line selection transistor Tas1, memory cell transistors Ma1 and Ma2, and bit line capacitor Ca1 constitute memory cell block 1a. Bit line selection transistor Tsb1, memory cell transistors Mb1 and Mb2, and bit line capacitor Cb1 constitute memory cell block 1b.

Referring to FIG. 1, for the sake of easy understanding, each memory cell block includes two memory cell transistors (Ma1 and Ma2 or Mb1 and Mb2). In practice, however, the number of memory cell transistors constituting each memory cell block can be increased (e.g., 256 to 1024 memory cell transistors per block). In this case, the number of word lines (W1 and W2) increases in accordance with the actual number of memory cell transistors.

Memory cell block 1a has a DRAM function using a synthetic capacitance (bit line equivalent capacitance Co: about 100 fF to 300 fF) consisting of the capacitance of bit line capacitor Ca1 and the stray capacitance (parasitic capacitance) of sub bit line BLsa1 as an information storage means. That is, information can be stored in capacitance Co of sub bit line BLsa1 according to the same operation principle of the DRAM by charging the bit line equivalent capacitance Co with the voltage of main bit line BLa1 when bit line selection transistor Tsa1 is turned on, and periodically refreshing the voltage of charged capacitance Co.

Memory cell block 1b has a DRAM function using a synthetic capacitance (bit line equivalent capacitance Co of about 100 fF to 300 fF) of the capacitance of bit line capacitor Cb1 and the stray capacitance of sub bit line BLsb1 as an information storage means. That is, information can be stored in capacitance Co of sub bit line BLsb1 according to the same operation principle of the DRAM by charging the bit line equivalent capacitance Co with the voltage of main bit line BLb1 when bit line selection transistor Tsb1 is turned on, and periodically refreshing the voltage of charged capacitance Co.

When the arrangement shown in FIG. 1 is regarded as a DRAM using bit line equivalent capacitance Co of sub bit line BLsa1 (BLsb1) as a memory cell capacitor as described above, main bit line BLa1 (BLb1) corresponds to a bit line of the DRAM, and bit line selection gate line ST1 corresponds to a word line of the DRAM.

The above DRAM structure of main bit line BLa1 serves as a write buffer which operates at a high speed relative to memory cell block 1a serving as an EEPROM. The above DRAM structure of main bit line BLb1 serves as a write buffer which operates at a high speed relative to memory cell block 1b serving as an EEPROM.

As memory elements decrease in size with advances in semiconductor manufacturing techniques, the value of the stray capacitance (the value of the parasitic capacitance between the sub bit line and the semiconductor region in which the sub bits line is formed) of sub bit line BLsa1/BLsb1 tends to decrease. If 100 to 300 fF or more can be ensured as the sum of such stray capacitances and the capacitances between the drains and sources of many memory cell transistors (Ma1 and Ma2/Mb1 and Mb2), capacitors Ca1 and Cb1 can be omitted.

FIG. 1 shows part of the arrangement of the EEPROM. An actual memory cell array includes many main/sub bit lines, word lines, selection gate lines, selection transistors, memory cell transistors, and the like. These memory cell transistors are arranged in the form of a matrix. Row and column decoder circuits (peripheral circuits) for specifying a predetermined memory cell in accordance with an external address input are connected to this memory cell matrix. A bit line precharge circuit and a sense amplifier for reading stored data from a specified memory cell transistor are connected to each of a plurality of main bit lines. The arrangements of these row and column decoder circuits, precharge circuits, and sense amplifiers in a general DRAM are known.

Sub bit line BLsa1 is connected to charge extraction completion detector 4a via switch circuit 5a, and sub bit line BLsb1 is connected to charge extraction completion detector 4a via switch circuit 5b. Each of charge extraction completion detectors 4a and 4b is constituted by a CMOS inverter having p-channel MOS transistor T6 on the positive power supply Vdd (+5 V) side, and n-channel MOS transistor T7 on the negative power supply Vss (0 V).

Charge extraction completion detector 4a generates output Da of Vss level (=0 V) if the potential of sub bit line BLsa1 is higher than the gate threshold (e.g., +2.5 V) of n-channel MOS transistor T7 when switch circuit 5a is closed, and generates output Da of the Vdd level (=5 V) if the potential of sub bit line BLsa1 is lower than the gate threshold (e.g., 5 V–2.5 V=2.5 V)) of p-channel MOS transistor T6 when switch circuit 5a is closed.

In other words, when output Da from charge extraction completion detector 4a is at Vss level (=0 V), extraction of the charges from the floating gate of target memory cell transistor Ma1 (or Ma2) connected to sub bit line BLsa1 is not completed. When output Da changes to the Vdd level (=5 V), the completion of extraction of the charges from the floating gate of target memory cell transistor Ma1 (or Ma2) connected to sub bit line BLsa1 is detected.

Similarly, when output Db from charge extraction completion detector 4b is at the Vss level (=0 V), extraction of the charges from the floating gate of target memory cell transistor Mb1 (or Mb2) connected to sub bit line BLsb1 is not completed. When output Db changes to the Vdd level (=5 V), the completion of extraction of the charges from the floating gate of target memory cell transistor Mb1 (or Mb2) connected to sub bit line BLsb1 is detected.

Word lines W1 and W2 are commonly connected to the output circuit of word line drive pulse generator 2 via word line switch circuit 3. Word line drive pulse generator 2 comprises a CMOS inverter (p-channel transistor T2+n-channel transistor T3) connected to a positive power supply of +3 V and a negative power supply of −10 V, a normally ON p-channel transistor T4 (which becomes a selection transistor if its gate potential is controlled) on the input side, and n-channel transistor T5 for positively feeding back an output from the CMOS inverter to the input side.

Word line drive pulse generator 2 generates pulse output WDPOUT whose potential changes between +3 V and −10 V in accordance with the signal potential of input WDSIN whose potential changes between 0 V and +5 V.

Upon reception of word line drive signal input WDSIN having the waveform shown in FIG. 2A, word line drive pulse generator 2 generates word line drive pulse output WDPOUT having the waveform shown in FIG. 2B. Circuit 2 has a level shifting function of changing a pulse of 0 V/+5 V like the one shown in FIG. 2A to a pulse of +3 V/−10 V like the one shown in FIG. 2B.

When word line switch circuit 3 is turned on, word line drive pulse output WDPOUT of +3 V/−10 V like the one shown in FIG. 2B is supplied to word lines W1 and W2. With this operation, all the memory cell transistors whose control gates are connected to word lines W1 and W2 (i.e., the memory cell transistors each having a drain to which a sufficient sub bit line potential is applied) can be set to a predetermined threshold to perform a batch erase operation by word line drive pulse output WDPOUT of +3 V/–10 V (a batch erase flash EEPROM operation to be performed for all the bits or a memory block at a time).

The circuit operations (erase/leakage current compensation) of bit line selection transistor Tas1 and memory cell transistor Ma1 of the EEPROM shown in FIG. 1 will be described with reference to FIGS. 3A and 3B. FIG. 3B shows a simplified circuit of the memory arrangement shown in FIG. 1. FIG. 3A shows the waveform of a voltage applied to each component.

Referring to FIG. 3B, main bit line BLa1 is connected to the drain of n-channel MOS memory cell transistor Ma1 via the drain-source path of bit line selection transistor Tas1, and bit line equivalent capacitance Co and leakage current component equivalent resistance Ro are connected in parallel between the drain and source of transistor Ma1.

In this case, bit line equivalent capacitance Co exhibits the synthetic value of the stray capacitance of sub bit line BLsa1 and the capacitance of bit line capacitor Ca1, and leakage current component equivalent resistance Ro exhibits the value of a path through which a current leaks from sub bit line BLsa1 into the source circuit (Vss/0 V) of memory cell transistor Ma1. Assume that bit line equivalent capacitance Co is about 1 pF, and leakage current component equivalent resistance Ro is about 1,000 MΩ.

Figures 11A, 11B, 11C:
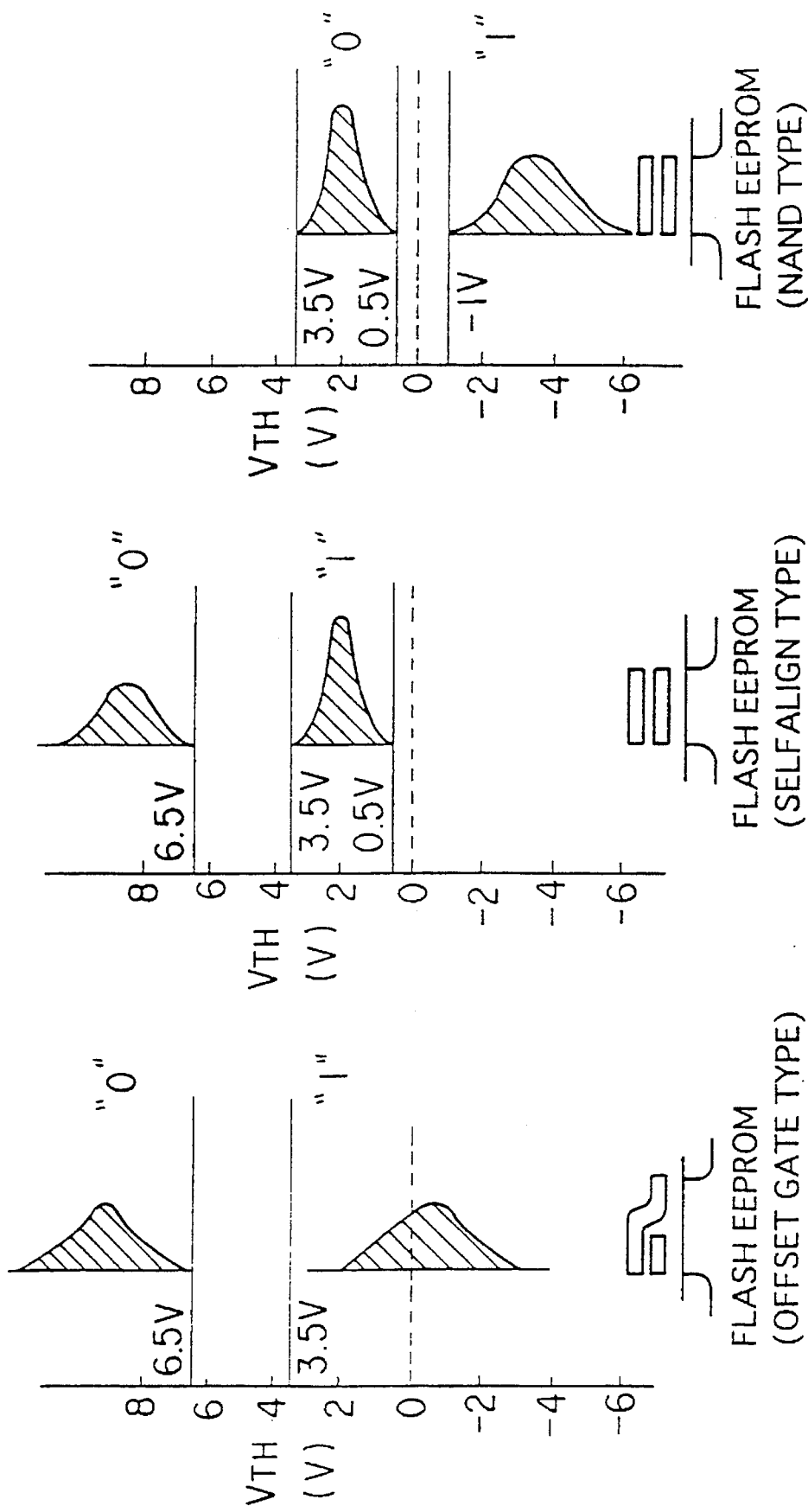

An erase operation (see FIG. 11B) will be described, provided that threshold voltage VTH of nonvolatile memory cell transistor Ma1 is 6.5 V or more at first.

When a potential of +5 V like the one shown at the upper portion in FIG. 3A is applied to main bit line BLa1 while a potential of +5 V like the one shown at the intermediate left portion in FIG. 3A is applied to bit line selection gate line ST1, transistor Tsa1 is turned on, and sub bit line BLsa1 is precharged to almost +5 V (a reference potential, 0 V=Vss, is set in the source circuit of memory cell transistor Ma1).

When the potential of bit line selection gate line ST1 is lowered to 0 V after the above operation as indicated by the intermediate left portion near the center in FIG. 3A, transistor Tsa1 is turned off, and sub bit line BLsa1 is electrically disconnected from main bit line BLa1 to be set in a floating state. In this state, the precharge potential of +5 V of sub bit line BLsa1 is maintained by the charges stored in bit line equivalent capacitance Co as a small capacitance (1 pF).

Subsequently, a word line drive pulse like the one shown at the lower left portion near the center in FIG. 3A is applied to the control gate of memory cell transistor Ma1 via word line W1. As this pulse, 6output WDPOUT from word line drive pulse generator 2 in FIG. 1 is used. In this case, the interval (0 V interval) during which the word line drive pulse shown at the lower portion in FIG. 3A is not generated is the interval during which word line switch circuit 3 in FIG. 1 is kept off. In the interval during which this pulse is generated, word line switch circuit 3 is kept on.

When word line switch circuit 3 is turned on, a voltage of +3 V is applied to the control gate of memory cell transistor Ma1 for a short period of time (e.g., 20 μs). However, since threshold voltage VTH is assumed to be 6.5 V or more at first, transistor Ma1 is kept off. At this point, if a drop in sub bit line potential due to a leakage current flowing via leakage current component equivalent resistance Ro can be still regarded as a negligible state, the floating state (+5 V) of sub bit line BLsa1 can be maintained.

When a word line drive pulse of –10 V is applied to the control gate of memory cell transistor Ma1 for a short period of time (e.g., 10 μs), a tunnel current flows between the floating gate and drain of memory cell transistor Ma1 whose drain is precharged to +5 V. With this tunnel current, some of the charges in the floating gate are extracted. As a result, threshold voltage VTH of memory cell transistor Ma1 drops to some degree.

Even if threshold VTH of memory cell transistor Ma1 drops to some degree, memory cell transistor Ma1 is not turned on as long as threshold voltage VTH is higher than +3 V equal to the voltage of the word line drive pulse.

Even in the interval during which memory cell transistor Ma1 is kept off, if a sufficient precharge potential is applied to the drain, charges are extracted from the floating gate little by little in the form of a tunnel current every time a word line drive pulse of –10 V is applied. As a result, threshold voltage VTH gradually drops.

The charge voltage (sub bit line precharge potential) of bit line equivalent capacitance Co drops with time owing to a tunnel current flowing in the floating gate of memory cell transistor Ma1 and a leakage current flowing in leakage current component equivalent resistance Ro. If this precharge potential excessively drops (i.e., the drain voltage of memory cell transistor Ma1 excessively drops), no tunnel current flows in the floating gate even if a voltage of –10 V is applied thereto. In such a case, a gradual drop in threshold voltage VTH of transistor Ma1 stops before the voltage reaches a desired value (e.g., +2.5 V) corresponding to +3 V of the word line drive pulse.

In order to prevent a drop in the sub bit line precharge potential, according to the arrangement shown in FIGS. 3A and 3B, bit line selection transistor Tas1 is intermittently and instantaneously turned on in the interval during which word line drive pulse output WDPOUT is applied to word line W1, thereby injecting a small amount of charge from main bit line BLa1 into sub bit line BLsa1 in a floating state.

More specifically, word line switch circuit 3 in FIG. 1 is turned off in accordance with the timing at which the potential of sub bit line BLsa1 in the floating state drops to some degree, and the application of word line drive pulse output WDPOUT to word line W1 is interrupted (for a period equal to or shorter than one period, 30 μs, of pulse WDPOUT, e.g., 7 μs), as indicated by the lower central portion in FIG. 3A. Thereafter, as indicated by the intermediate central portion in FIG. 3A, a short pulse of 5 V (e.g., a pulse of a width 3 μs with an OFF interval of 2 μs between the adjacent pulses) is applied to bit line selection transistor Tsa1 to instantaneously turn it on in the interval during which word line drive pulse output WDPOUT is not generated, thereby restoring sub bit line BLsa1, whose potential has dropped, to the precharge state corresponding to +5 V.

With a combination of the pulses indicated by the intermediate and lower portions in FIG. 3A described above, the potential (about +5 V) of sub bit line BLsa1 in a floating state is ensured even if a bit line leakage current flows. With this operation, by repeatedly applying word line drive pulse output WDPOUT of –10 V, charges are extracted from memory cell transistor Ma1 in the floating gate little by little.

When threshold voltage VTH of memory cell transistor Ma1s drops to a desired value (+2.5 V) as a result of the extraction of the charges, memory cell transistor Ma1 is turned on by word line drive pulse output WDPOUT of +3 V, and the potential of sub bit line BLsa1 drops to 0 V.

Subsequently, the extraction of charges from the floating gate of memory cell transistor Ma1 is stopped, and threshold voltage VTH of memory cell transistor Ma1 is accurately set to a desired value, i.e., +2.5 V (corresponding to the erased state of memory cell transistor Ma1).

The completion of the erase operation of memory cell transistor Ma1 is detected (Da="1") by charge extraction completion detector 4a shown in FIG. 1 and connected to sub bit line BLsa1. After the completion of the erase operation is detected, the application of the pulse having a width of 3 μs and indicated by the intermediate central portion in FIG. 3A is also stopped.

If the above erase operation is simultaneously performed with respect to all the memory cell transistors (Ma1 and Ma2) of memory cell block 1a, a batch erase operation (flash erase operation) in units of blocks can be realized. If this erase operation is simultaneously performed with respect to all the memory cell blocks, a batch erase operation in units of memory chips can be realized. If this erase operation is sequentially performed for each memory cell transistor, an erase operation in units of bits can be realized.

In any of the erase operations, the potential of a sub bit line is kept at a predetermined value (about +5 V), and extraction of charges from the floating gate of each memory cell transistor is sequentially performed while the sub bit line potential is sequentially compared with a predetermined word line potential (+3 V). Therefore, threshold voltages VTH of all the memory cell transistors can be caused to accurately converge to a desired value (+2.5 V).

In addition, since this converging operation can be completed by 10 pulses of word line drive pulse output WDPOUT (a maximum of about 300 μs using pulses each corresponding to 30 μs), a flash erase operation in units of blocks or memory chips can be performed at a high speed (within 300 μs).

A mechanism for preventing an over-erased state when threshold voltage VTH of memory cell transistor Ma1 is lower (e.g., +2 V) than the desired value will be described next.

First of all, similar to the case wherein threshold voltage VTH is higher than the desired value, potential Vss of the source line of memory cell transistor Ma1 is set to the ground potential, i.e., 0 V, and bit line selection transistor Tsa1 is turned on to precharge the potential of sub bit line BLsa1 to +5 V. Thereafter, bit line selection transistor Tas1 is turned off to set sub bit line BLsa1 in a floating state corresponding to +5 V. In this case, bit line equivalent capacitance Co is in a charged state.

Subsequently, a word line drive pulse like the one indicated by the lower portion in FIG. 3A is applied to word line W1. Since the drain of memory cell transistor Ma1, whose threshold voltage VTH is lower (+2 V) than the desired value, is set at the sub bit line precharge voltage (+5 V), when a pulse of +3 V is applied to the control gate, memory cell transistor Ma1 is turned on. As a result, a channel current flows between the drain and source of this memory cell transistor, and bit line equivalent capacitance Co is discharged, leading to a drop in drain voltage. In this state, even if a pulse of −10 V is applied to the control gate of memory cell transistor Ma1, no tunnel current flows between the floating gate and the drain. For this reason, charges are not extracted any more from the floating gate of memory cell transistor Ma1 whose initial threshold voltage VTH is low, thus preventing an over-erased state.

Assume that 10 pulses of word line drive pulse output WDPOUT are applied to a memory cell transistor, whose threshold voltage VTH (+2 V) is lower than the desired value (+2.5 V), after data "0" is written, and charges are injected into the floating gate to raise threshold voltage VTH (+6.5 V or more). In this case, threshold voltage VTH converges to the desired value (+2.5 V).

As described above, in the EEPROM of the present invention, threshold voltage VTH of a memory cell transistor whose initial threshold voltage VTH is higher than the desired value is caused to converge to the desired value, and no charges are extracted from the floating gate of a memory cell transistor whose initial threshold voltage VTH is lower than the desired value.

With this operation, even if a plurality of memory cell transistors exhibiting variations in threshold voltage VTH are subjected to a batch erase operation, no memory cell undergoes an over-erased state, and threshold voltages VTH of almost all the memory cell transistors can be caused to accurately converge to the desired value. The present invention, therefore, does not require a time-consuming operation of "matching the thresholds of nonvolatile memories by a write operation before an erase operation" in the prior art.

The erase, write, read, and refresh operations of the DRAM type memory shown in FIG. 1 or 3B will be summarized.

[Erase Operation]

(1) The row (gate line ST1) and column (bit line BLa1/BLb1) of a DRAM cell portion including at least one target memory cell transistor (e.g., Ma1 or Ma2, or Mb1 or Mb2) to be subjected to an erase operation are designated by row and column decoders (not shown), and a selection transistor (Tas1/Tsb1) is turned on. With this operation, the DRAM cell portion (sub bit line BLsa1/BLsb1) is precharged to +5 V.

(2) While the drain (sub bit line BLsa1/BLsb1) of at least one target memory cell transistor (Ma1 or Ma2, or Mb1 or Mb2) is precharged to +5 V, erase word line drive pulse WDPOUT like the one shown in FIG. 2B is applied to the control gate (word line W1/W2) of at least one target memory cell transistor (Ma1 or Ma2, or Mb1 or Mb2). With this operation, the threshold of each target memory cell transistor (Ma1 or Ma2, or Mb1 or Mb2) is caused to converge to the desired value (e.g., +2.5 V) (batch erase operation of all bits; flash EEPROM operation). With this batch erase operation of all the bits, for example, data "1" (corresponding to a threshold of 2.5 V) is written in each memory cell transistor.

[Write Operation (after erase operation)]

(1) The row (gate line ST1) and column (bit line BLa1) of a DRAM cell portion (bit line equivalent capacitance Co of sub bit line BLsa1) including a target memory cell transistor (e.g., Ma1) to be subjected to a write operation are designed by row and column decoders (not shown), and a selection transistor (Tas1) is turned on (if the power supply voltage of the memory is +5 V, for example, a voltage of +7 V is applied to the gate of selection transistor Tas1). With this operation, bit line equivalent capacitance Co of the DRAM cell portion is charged to a write data voltage (a voltage corresponding to "1" or "0"; data "1" corresponding to, e.g., 0 V, and data "0" corresponding to, e.g., +5 V).

(2) The drain (sub bit line BLsa1) of a target memory cell transistor (Ma1) is set to a write voltage (the charge voltage of bit line equivalent capacitance Co), and a high write voltage (e.g., +6 V) is applied to the control gate (word line W1) of this memory cell transistor (Ma1), thereby injecting hot electrons corresponding to the write voltage into the floating gate of the memory cell transistor (Ma1). With this operation, information is written in the target memory cell transistor (Ma1) using the DRAM cell portion (sub bit line BLsa1) as a write buffer.

More specifically, if the write data stored in bit line equivalent capacitance Co is "0" (sub bit line BLsa1=+5 V), hot electrons are injected into the floating gate of the target memory cell transistor (Ma1) to raise its threshold to, e.g., 6.5 V or more. If the write data is "1" (sub bit line BLsa1=0 V), the threshold of the target memory cell transistor (Ma1) is kept at 2.5 V as in an erase operation without injecting any hot electrons.

[Read Operation]

(1) The row (gate line ST1) and column (bit line BLa1) of a DRAM portion (equivalent capacitance Co of sub bit line BLsa1) including a target memory transistor (e.g., Ma1) to be subjected to a read operation are designated by row and column decoders (not shown), and a selection transistor (Tas1) is turned on. With this operation, the potential of the DRAM cell portion (sub bit line BLsa1) is precharged to a low voltage (e.g., +1 to 2 V) which does not cause injection of electrons (hot electrons) into the target memory cell transistor (Ma1). For this purpose, the potential of the column (bit line BLa1) in a read operation is set to be relatively low (e.g., +2.5 V).

(2) The potential of the control gate (word line W1) of the target memory cell transistor (Ma1) is set to an intermediate potential (about +4 V) between data "0" (a threshold of +6.5 V) and data "1" (a threshold of +2.5 V).

If the data stored in the target memory cell transistor (Ma1) is "0", since the transistor (Ma1) is kept off, the potential of the DRAM cell portion (sub bit line BLsa1) is set at the preset potential (+1 to 2 V). This potential is detected by a sense amplifier (not shown) connected to sub bit line BLsa1 and is read out as data "0".

If the data stored in the target memory cell transistor (Ma1) is "1", this transistor (Ma1) is turned on (a memory cell current flows). As a result, the potential of the DRAM cell portion (sub bit line BLsa1) drops to almost 0 V. This potential of almost 0 V is detected by a sense amplifier (not shown) connected to sub bit line BLsa1 and is read out as data "1".

[Refresh Operation]

(1) The voltage information (high/low voltage) stored in bit line equivalent capacitance Co of a DRAM cell portion (sub bit line BLsa1) is periodically read out by a sense amplifier (not shown).

(2) The sense amplifier detects the high voltage information (+5 V in a write operation; +1 to 2 V in a read operation) of sub bit line BLsa1 and, at the same time, recharges sub bit line BLsa1 with the same voltage as that detected.

In the above manner, the voltage information stored in the DRAM cell portion (sub bit line BLsa1) is refreshed in a data read operation or at a predetermined refresh period (this operation is the same as that in a known DRAM). With this operation, the information (the voltage information stored in bit line equivalent capacitance Co) in the DRAM cell portion is maintained unless the information is rewritten by an external unit or the power supply of the apparatus is turned off.

Figure 4:
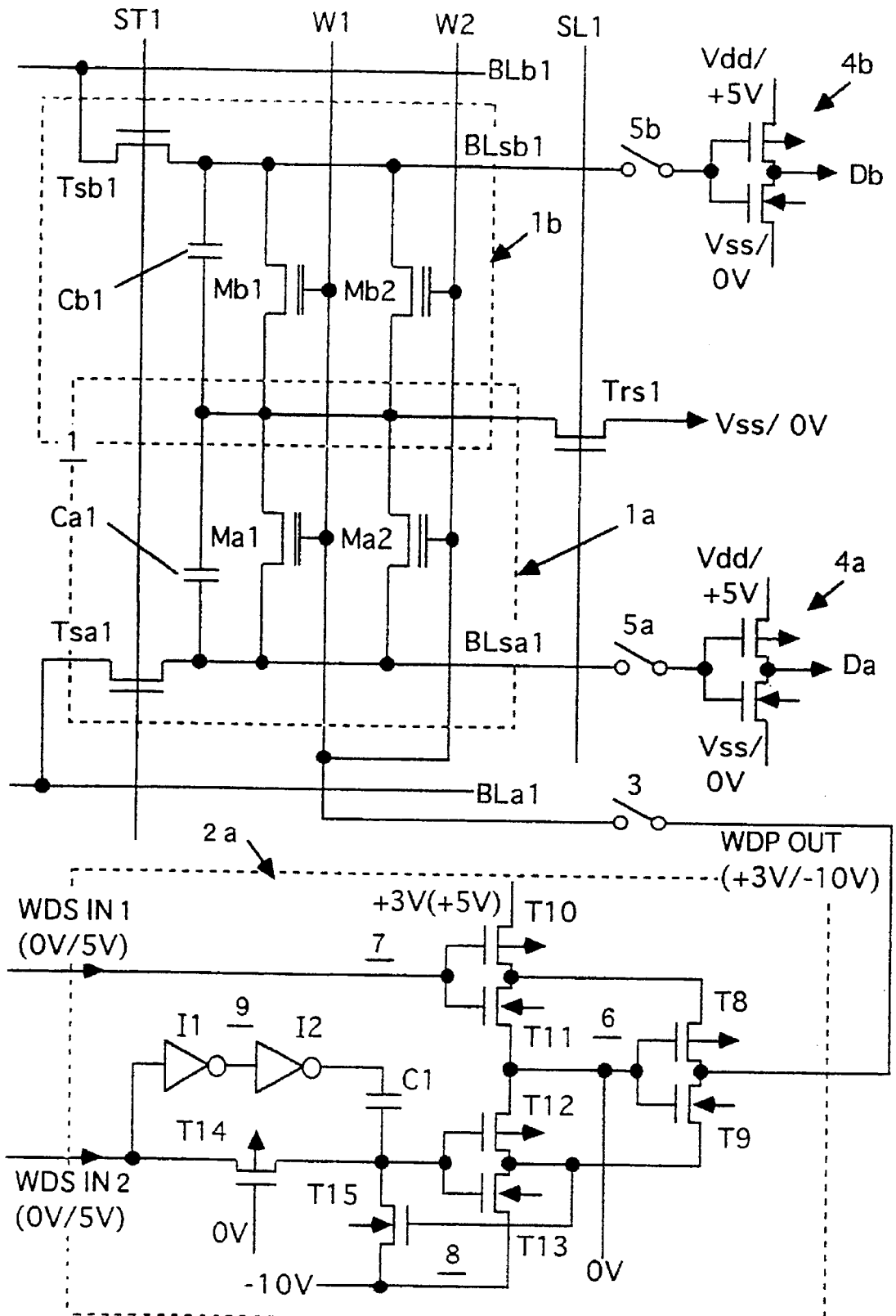
FIG. 4 is a circuit diagram for explaining the arrangement of a nonvolatile semiconductor memory according to the second embodiment of the present invention.

A nonvolatile semiconductor memory according to the second embodiment of the present invention will be described next with reference to FIG. 4. The arrangement of the embodiment shown in FIG. 4 is the same as that of the first embodiment except that a word line drive pulse generator 2a has an arrangement different from that of the word line drive pulse generator 2. For this reason, a description of identical portions will be omitted.

Word line drive pulse generator 2a comprises CMOS inverter 6 constituted by transistors T8 and T9, CMOS inverter 7 constituted by transistors T10 and T11, CMOS inverter 8 constituted by transistors T12 and T13, speed-up circuit 9 (increasing the rising/falling speed of an input pulse to CMOS inverter 8) constituted by a series circuit of inverters I1 and I2 and capacitor C1, normally ON transistor T14 (serving as a selection transistor upon control of the gate potential), and positive feedback transistor T15. The drains of transistors T11 and T12 are connected to each other and to the input terminal of CMOS inverter 6, and a voltage of 0 V is applied to the connection point thereof.

The positive power supply (the source side of p-channel MOS transistor T10) of CMOS inverter 7 is set at a voltage of +3 V (or +5 V), which corresponds to the positive pulse potential of word line drive pulse output WDPOUT. The output terminal of CMOS inverter 7 is connected to the source of p-channel MOS transistor T8.

The negative power supply (the source side of n-channel MOS transistor T13) of CMOS inverter 8 is set at a voltage of −10 V, which corresponds to the negative pulse potential of word line drive pulse output WDPOUT. The output terminal of CMOS inverter 8 is connected to the source of n-channel MOS transistor T9.

The source of n-channel MOS transistor T11 and the drain of p-channel MOS transistor T12 are connected to the input terminal of CMOS inverter 6. The output terminal of speed-up circuit 9 and the drain of n-channel MOS transistor T15 are connected to the input terminal of CMOS inverter 8, and the gate of transistor T15 is connected to the output terminal of CMOS inverter 8. The source of transistor T15 is connected to a negative power supply of −10 V.

Pulses each having a peak value of 5 V are respectively applied to the input terminals of CMOS inverters 7 and 8. A positive voltage of +3 V (or 5 V) is applied to the source of transistor T10. A negative voltage of −10 V is applied to the source of transistor T13.

When word line drive signals WDSIN1 and WDSIN2 like those shown in FIGS. 5A and 5B are input to word line drive pulse generator 2a in FIG. 4, word line drive pulse output WDPOUT like the one shown in FIG. 5C can be obtained, provided that the positive power supply voltage of CMOS inverter 7 is +3 V.

When word line drive signals WDSIN1 and WDSIN2 like those shown in FIGS. 5D and 5E are input to word line drive pulse generator 2a in FIG. 4, word line drive pulse output WDPOUT like the one shown in FIG. 5F can be obtained, provided that the positive power supply voltage of CMOS inverter 7 is +5 V.

FIGS. 5C and 5F show different waveforms of pulses WDPOUT to demonstrate variations.

If word line drive pulse output WDPOUT in FIG. 5C is applied to each of memory cell transistors Ma1 and Ma2/Mb1 and Mb2 in FIG. 4, threshold voltage VTH of each memory cell transistor can be caused to converge to a value corresponding to the voltage, +3 V, of pulse WDPOUT while electrons are extracted little by little from the floating gate of each memory cell transistor when pulse WDPOUT is set at −10 V.

If word line drive pulse output WDPOUT in FIG. 5F is applied to each of memory cell transistors Ma1 and Ma2/Mb1 and Mb2 in FIG. 4, threshold voltage VTH of each memory cell transistor can be caused to converge to a value corresponding to the voltage, +5 V, of pulse WDPOUT while electrons are extracted little by little from the floating gate of each memory cell transistor when pulse WDPOUT is set at −10 V.

The influence of large leakage of charges precharged in sub bit line BLsa1 due to leakage current component equivalent resistance Ro shown in FIG. 3B will be described next.

Assume that word line drive pulse generator 2a in FIG. 4 is operated with the waveforms shown in FIGS. 5D to 5F. In this case, FIG. 6A exemplifies voltage waveform VFG at the floating gate of a MOS transistor constituting each memory cell; FIG. 6B, voltage change VBL at a sub bit line to which the MOS transistor is connected; and FIG. 6C, voltage waveform VCG at the control gate of the MOS transistor.

Referring to FIGS. 6A to 6C, assume that curve (a) corresponds to memory cell transistor Ma1 in FIG. 4; curve (b), memory cell transistor Mb1 in FIG. 4; and curve (c), a memory cell transistor connected to the third sub bit line.

If the value of equivalent resistance Ro shown in FIG. 3B is small, i.e., a leakage current in the sub bit line is large, floating gate voltage VFG does not easily converge to a desired value. FIG. 6A shows a waveform in such a case.

More specifically, when a pulse whose peak value fluctuates from 5 V to −10 V is applied to the control gate of a nonvolatile memory cell transistor to perform an erase operation as shown in FIG. 6C, floating gate voltage VFG fluctuates in accordance with the amplitude of a pulse applied to the control gate electrode as shown in FIG. 6A. In this process, owing to the leakage current (leakage current flowing via resistance Ro) in the sub bit line, sub bit line voltages VBL to which nonvolatile memory cell transistors (a), (b), and (c) are connected abruptly drop (at different change rates), as shown in FIG. 6B. If, however, the sub bit line potential drops too quickly, the threshold voltages of nonvolatile memory cell transistors (1), (b), and (c) having different floating gate voltages VFG do not easily converge to predetermined threshold voltage VTH.

By using the embodiment shown in FIG. 3B, a drop in sub bit line voltage like the one shown in FIG. 6B can be prevented by the intermittent ON operation of bit line selection transistor Tas1. Therefore, threshold voltage VTH (corresponding to floating gate voltage VFG) of each memory cell transistor can be reliably caused to converge to the desired value.

A nonvolatile semiconductor memory according to the third embodiment of the present invention will be described next with reference to FIGS. 7A to 7C.

Figure 7A:
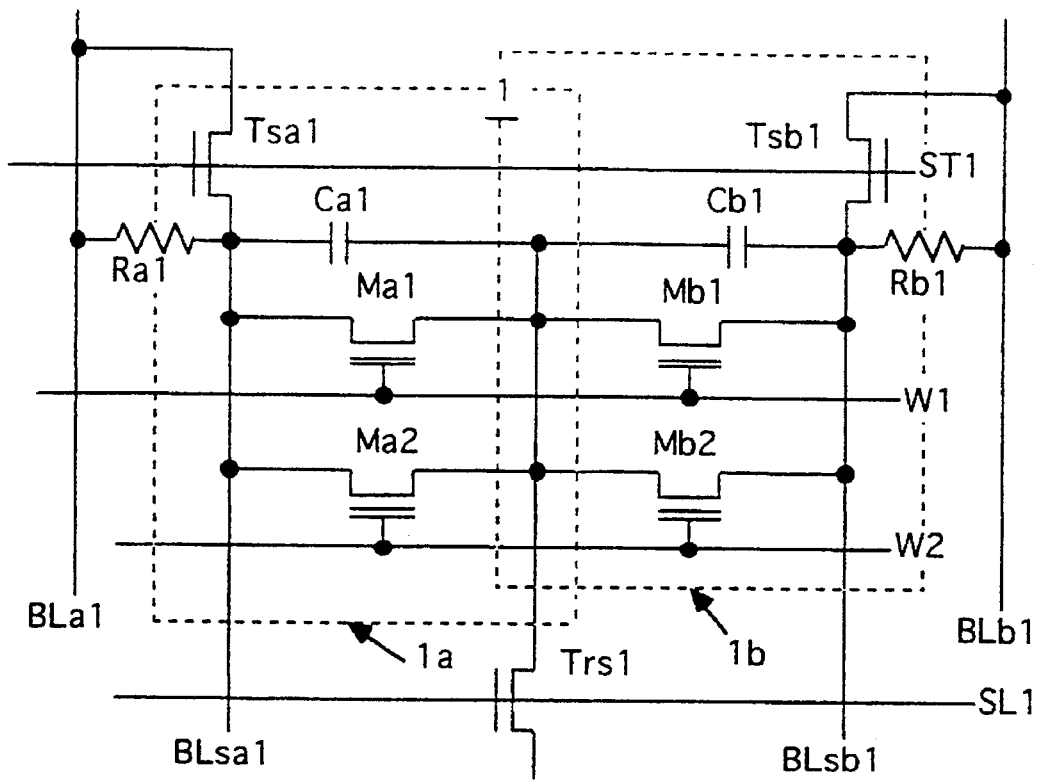
FIG. 7A is a circuit diagram showing the arrangement of the main part of a nonvolatile semiconductor memory according to the third embodiment of the present invention.

FIG. 7A shows an embodiment based on the assumption that large leakage currents constantly flow in sub bit lines BLsa1 and BLsb1. For this reason, this embodiment includes current supply means (Ra1 and Rb1) for compensating for the sub bit line leakage currents. More specifically, resistor Ra1 is arranged between main bit line BLa1 and sub bit line BLsa1 of memory cell block 1a, and resistor Rb1 is arranged between main bit line BLb1 and sub bit line BLsb1 of memory cell block 1b.

If a leakage current is large, the precharge potential of sub bit line BLsa1 drops in a short period of time, as indicated by curve (c) in FIG. 6B. For this reason, a current equal to or larger than the leakage current due to equivalent resistance Ro is supplied from main bit line BLa1 to sub bit line BLsa1 via resistor Ra1 to suppress the drop in the precharge potential of sub bit line BLsa1. Similarly, a current equal to or larger than the leakage current due to equivalent resistance Ro is supplied from main bit line BLb1 to sub bit line BLsb1 via resistor Rb1 to suppress the drop in the precharge potential of sub bit line BLsb1.

Figures 7B, 7C:
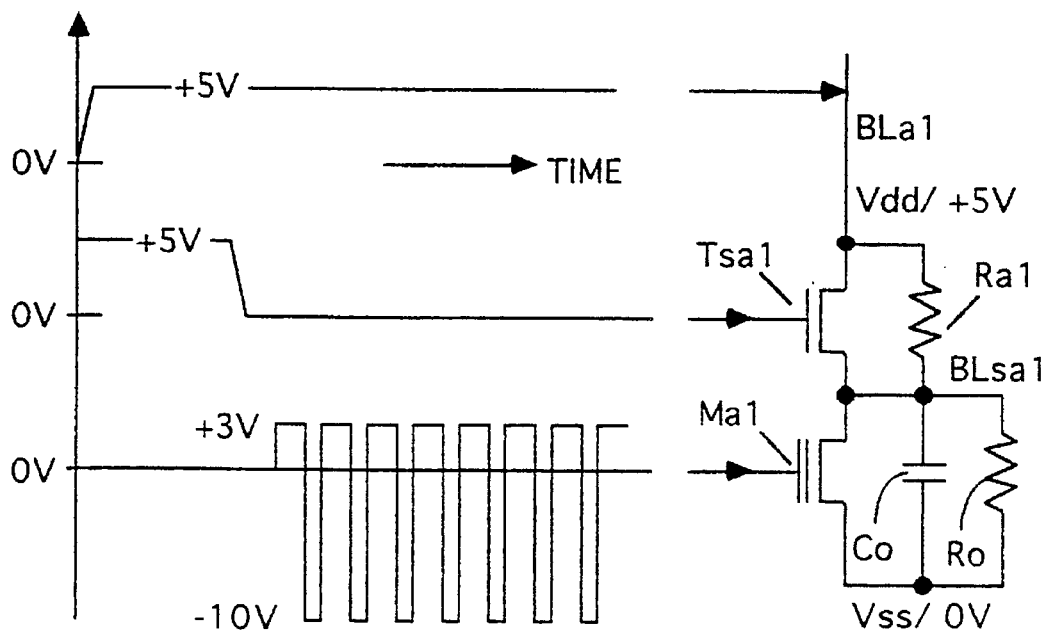
FIG. 7B is a timing chart showing the waveforms of voltages used in the main part of the circuit arrangement shown in FIG. 7A.
FIG. 7C is an equivalent circuit diagram based on a capacitance component on the bit line and a leakage current component in the circuit arrangement in FIG. 7A.

FIG. 7C is an equivalent circuit diagram of the main part of the EEPROM in FIG. 7A, and FIG. 7B shows the waveforms of voltages applied to the respective components of this equivalent circuit. Reference symbol Co denotes an equivalent capacitance component (stray capacitance) which parasites in sub bit line BLsa1; Ro, an equivalent resistance determined by a voltage to be applied to sub bit line BLsa1 and a leakage current flowing therein; and Ra, a leakage current compensation resistance for supplying a current equal to or larger than a leakage current due to equivalent resistance Ro to sub bit line BLsa1.

Figure 8A:
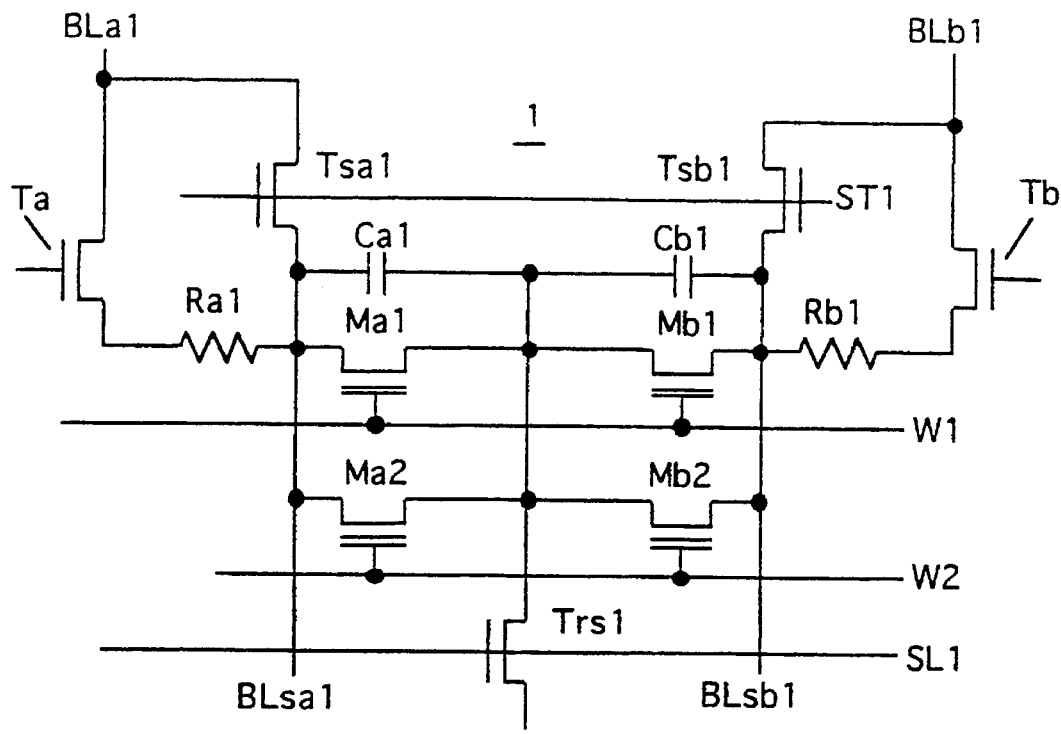
FIG. 8A is a circuit diagram showing the arrangement of the main part of a nonvolatile semiconductor memory according to the fourth embodiment of the present invention.
Figures 8B, 8C:
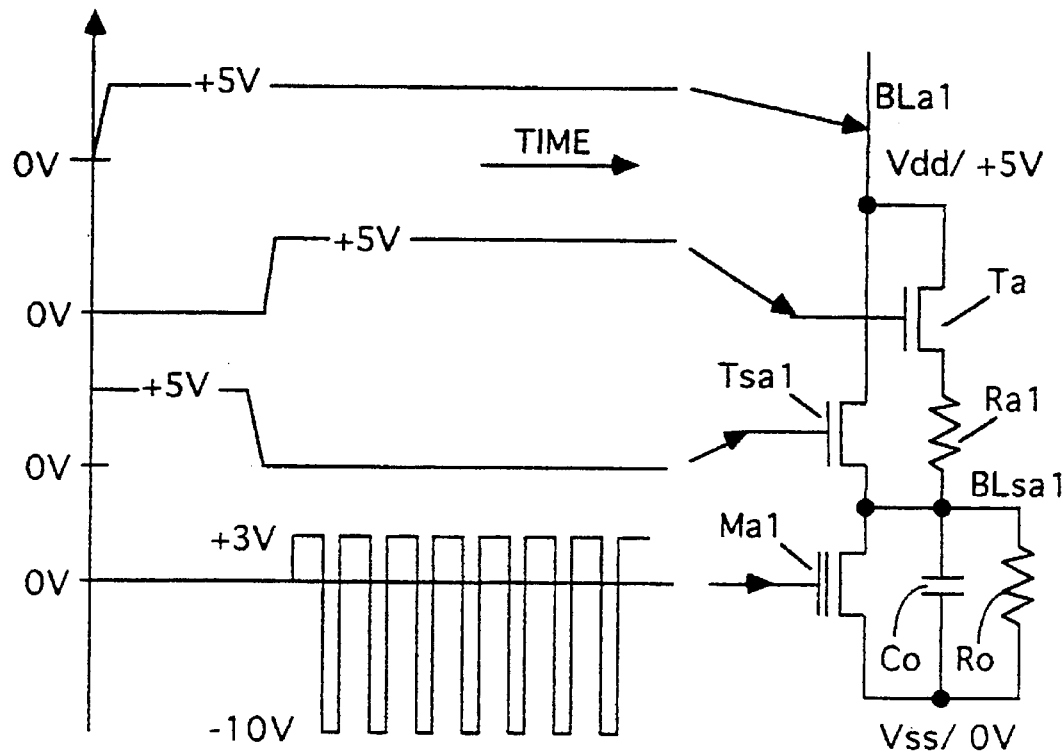
FIG. 8B is a timing chart showing the waveforms of voltages used in the main part of the circuit arrangement shown in FIG. 8A.
FIG. 8C is an equivalent circuit diagram based on a capacitance component on the bit line and a leakage current component in the circuit arrangement in FIG. 8A.

If a word line drive pulse like the one indicated by the lower portion in FIG. 8B is applied to the control gate of a memory cell transistor while a drop in the precharge potential of sub bit line BLsa1 (BLsb1) is prevented by using resistor Ra1 (Rb1) in FIG. 7A, threshold voltage VTH of each memory cell transistor can be reliably caused to converge to a desired value corresponding to the voltage, +3 V, of the word line drive pulse.

A nonvolatile semiconductor memory according to the fourth embodiment of the present invention will be described next with reference to FIGS. 8A to 8C.

Memory cell array 1 in FIG. 8A has the same arrangement as that in the embodiment shown in FIG. 7A. A current supply circuit for compensating for a leakage current is constituted by a series circuit of resistor-connected transistor Ta (Tb) and resistor Ra1 (Rb1). The drain of transistor Ta (Tb) is connected to one terminal of resistor Ra1 (Rb1), and the other terminal of resistor Ra1 (Rb1) is connected to sub bit line BLsa1 (BLsb1).

FIG. 8C is an equivalent circuit diagram of the main part shown in FIG. 8A. FIG. 8B shows the waveforms of voltages applied to the respective components of the main part. When resistor-connected transistor Ta is turned on by a +5-V signal indicated by the intermediate portion in FIG. 8G, a current equal to or larger than a leakage current is supplied to sub bit line BLsa1 via resistor Ra1.

In the embodiment shown in FIG. 7A or 8A, the high resistance of a reverse-biased diode may be used as leakage current compensation resistor Ra1 or Rb1.

A leakage current in a sub bit line may be caused by an inter-drain tunnel current generated when the gate voltage of a memory cell transistor is negative or a crystal defect near a diffused drain layer. In particular, the former may be the main cause.

In the embodiment shown in FIGS. 8A to 8C, in synchronism with a leakage current, a current for compensating for the leakage current is supplied to a sub bit line to which the drain of a memory cell transistor is connected. The variations in sub bit line voltage, therefore, can be reduced.

In the embodiment shown in FIGS. 3C, 7C, or 8C, the leakage current compensation circuit (Tas1, Ra1, or Ta+Ra1) compensates for charges escaping via leakage current component equivalent resistance Ro. For this reason, the charges stored in sub bit line BLsa1 can be held for a long period of time while bit line selection transistor Tsa1 is kept off.

A DRAM arrangement capable of setting a long refresh period can be realized by using bit line selection transistor Tsa1 as a transfer gate, and equivalent capacitance Co of sub bit line BLsa1 as an information storage capacitance.

In the embodiments shown in FIGS. 3C and 8C, even if a leakage current flows, the high potential information in sub bit line BLsa1 can be kept. The low potential information in sub bit line BLsa1 can be kept by setting transistor Tsa1 or Ta in an OFF state. In the embodiment shown in FIG. 7C, however, if the potential of main bit line BLa1 is kept high, a leakage compensation current constantly flows into sub bit line BLsa1 via compensation resistor Ra1. That is, this embodiment is not suitable for maintaining the low potential information in sub bit line BLsa1 for a long period of time. When the embodiment shown in FIG. 7C is to be employed, therefore, the embodiment may be designed such that the potential of main bit line BLa1 is kept low in the interval during which low potential information is held in sub bit line BLsa1.

FIGS. 9A to 9C show the operations of a nonvolatile memory cell transistors ((a); e.g., Ma1) and ((b); e.g., Mb1) having different floating gate voltages (VFG).

As shown in FIG. 9C, a pulse having a period of 30 μsec and changing in amplitude between positive and negative voltages (3 V and −10 V) is applied to the floating gate of a memory cell transistor. In this case, as shown in FIG. 9A, the floating gate voltage (VFG) varies in accordance with the period of this pulse. The different floating gate voltages (VFG) of the memory cell transistors (a) and (b) drop little by little and gradually converge to a predetermined voltage owing to tunnel currents flowing from the floating gates at the control gate voltage of −10 V in FIG. 9C.

Referring to FIG. 9B, drain voltage/bit line voltage VBL (the voltage of sub bit line BLsb1) of a memory cell transistor ((b); e.g., Mb1) rises and drops, i.e., pulsates, when a supply current flows from resistor Rb1 and the memory transistor is turned on, after a predetermined amount of charge is extracted from the floating gate of the transistor.

As shown in FIG. 9B, the drain of a memory cell transistor ((a); e.g., Ma1) is held at a sufficient potential until a large number of electrons stored in the floating gate are extracted. The above pulsation hardly occurs until the extraction of a predetermined amount of electrons is completed (this memory cell transistor is turned off).

In the embodiment shown in FIG. 7A or 8A, the integral time constant (RoCo) determined by the product of the values of equivalent resistance Ro and capacitance component Co is set to be larger than the period of a word line drive pulse to be applied to the floating gate of the memory cell transistor. This operation is performed to suppress variations in the voltage of a sub bit line like those indicated by curve (b) in FIG. 9B upon application of a word line drive pulse. If, for example, a word line drive pulse has a period of 30 μs, this time constant (RoCo) is set to be about 100 to 300 μsec. More specifically, if bit line equivalent capacitance Co is about 100 to 300 fF, the resistance of resistor Ra1 is set to be about 1,000 MΩ.

Figure 10:
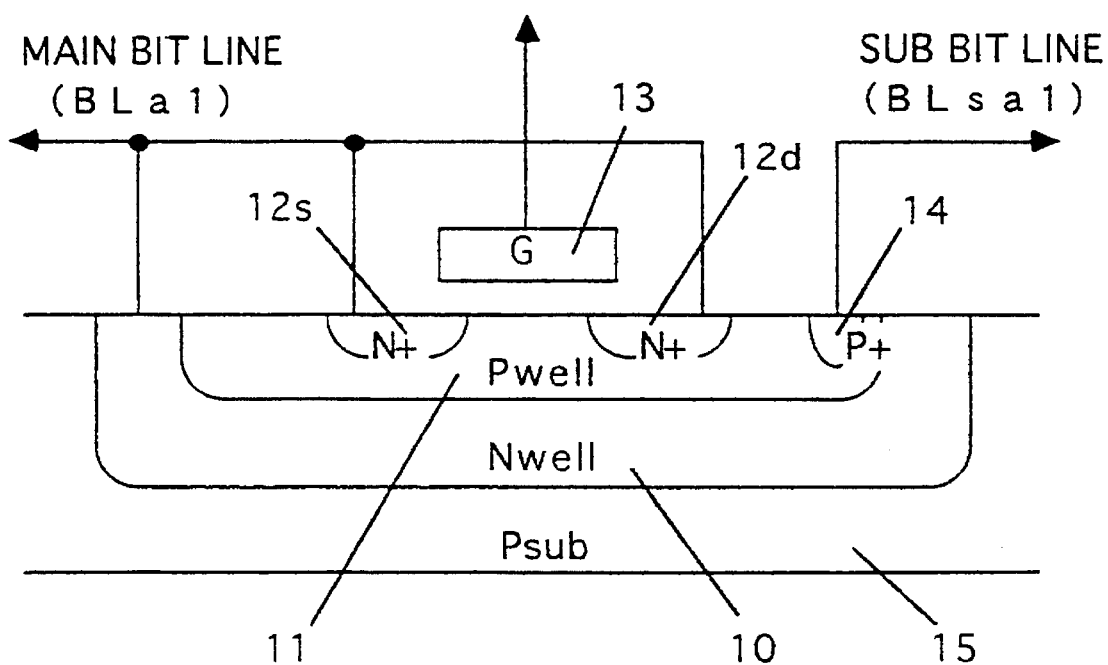
FIG. 10 is a sectional view showing the arrangement of a MOS diode with a control gate which can be used as a substitute for a compensation current supply circuit (Ta, Ra1) shown in FIG. 8C.

FIG. 10 shows an example of the arrangement of a MOS diode with a control gate, which can be used as a substitute for the compensation current supply circuit (Ta, Ra1) shown in FIG. 8C.

More specifically, p-type well (Pwell) 11 is formed in n-type well (Nwell) 10 formed in p-type substrate (Psub) 15. Source region 12s and drain region 12d are formed in p-type well 11. Gate electrode 13 is formed in the channel region between regions 12s and 12d. The same voltage signal as that applied to transistor Ta in FIG. 8C is applied to gate electrode 13.

A main bit line (BLa1) is connected to n-type source and drain regions 12s and 12d and n-type well 10. P-type well 11 is connected to a sub bit line (BLsa1) via $p^+$-type region 14. A voltage signal (the waveform at the intermediate upper position in FIG. 8B) to be applied to gate electrode 13 is synchronized with a voltage signal (the waveform at the intermediate lower position in FIG. 8B) to be applied to the gate of bit line selection transistor Tas1. With this operation, variations in the voltage of the sub bit line (BLsa1) can be suppressed.

As described above, the apparatus of this embodiment of the present invention includes the compensation current supply circuit for supplying a current larger than a leakage current to a sub bit line to maintain the potential of the precharged sub bit line. That is, a current supply circuit constituted by a resistor (Ra1) and the like is arranged between a main bit line and a sub bit line. As is apparent, this compensation current supply circuit is not limited to the one in the embodiment (Ra1, Ta, and the MOS diode with the gate in FIG. 10), and various known circuits which are equivalent in circuit function to the compensation current supply circuit can be used.

The nonvolatile semiconductor memory of the present invention is not limited to the memory array shown in FIG. 1. The present invention can be applied to various types of memory cell arrays, e.g., a memory cell array in which memory cell blocks, each consisting of many memory cell transistors (several hundreds or more), are respectively connected to a large number of main bit lines.

Figure 12:
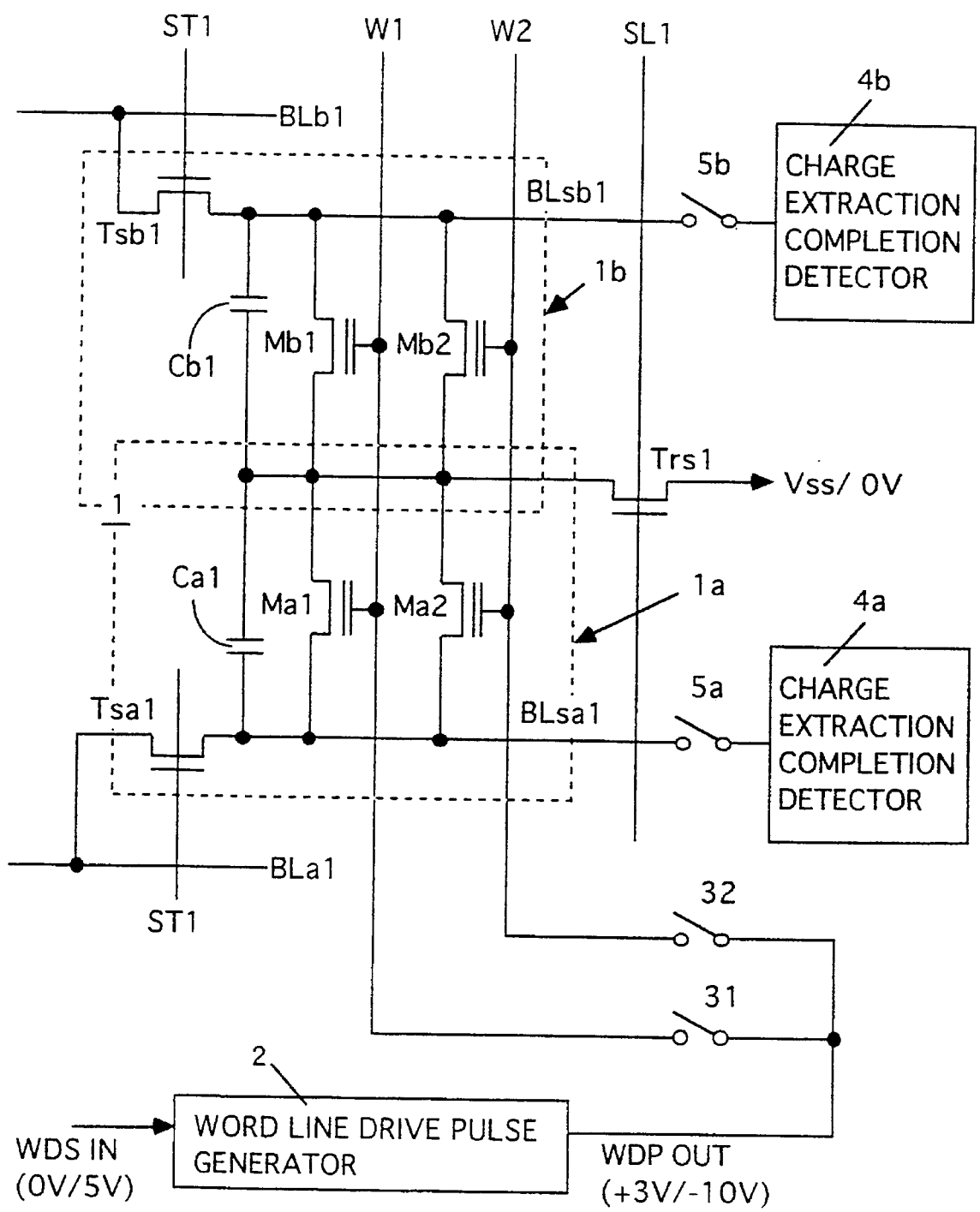
FIG. 12 is a circuit diagram for explaining the arrangement of a nonvolatile semiconductor memory according to the fifth embodiment of the present invention.

FIG. 12 shows the arrangement of a nonvolatile semiconductor memory according to the fifth embodiment of the present invention, which is also a modification of the embodiment shown in FIG. 1 or 4.

The number of word line switch circuits 3 in FIG. 1 may be set to be equal to the number of memory cell transistors Ma1 and Ma2 (Mb1 and Mb2) constituting memory cell block 1a (1b), as shown in FIG. 12. If, for example, memory cell block 1a is constituted by 1,024 memory cell transistors Ma1 to Ma1024, 1,024 word line switch circuits are prepared. Alternatively, word line switch circuit 3 may be constituted by a multiplexer for sequentially connecting the output terminal of word line drive pulse generator 2 to 1,024 word lines W1 to W1024.

Referring to FIG. 12, if all word line switch circuits 31 and 32 are simultaneously turned on to simultaneously connect all the word lines to the output terminal of word line drive pulse generator 2, the data in the memory cell transistors in all the memory cell blocks can be simultaneously erased (a batch erase operation of a flash EEPROM).

If word line switch circuits 31 and 32 are turned on each at a time to connect a specific word line to the output terminal of word line drive pulse generator 2, the data in only specific memory cell transistors in each memory cell block can be erased (an erase operation in a bit unit).

Figure 13:
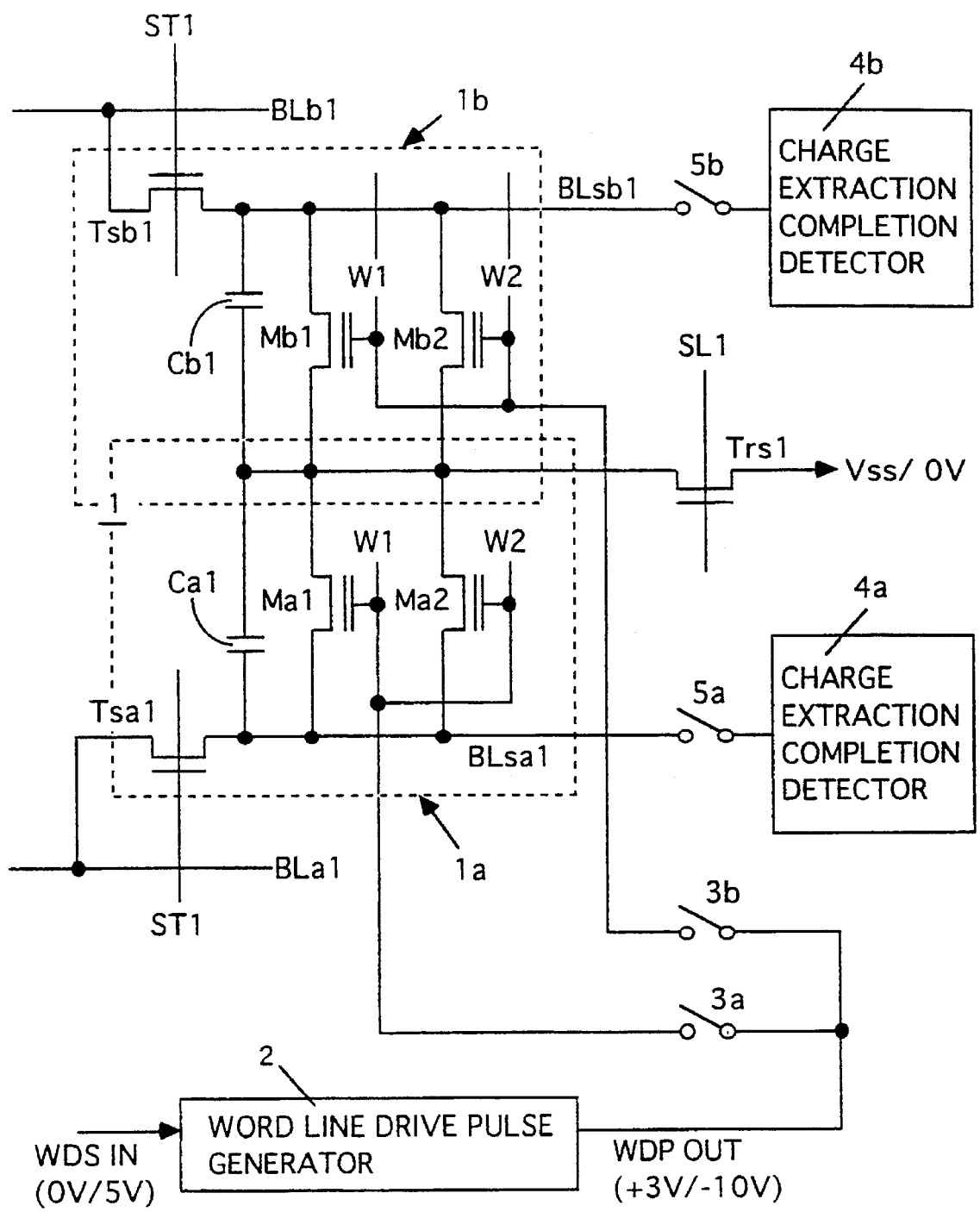
FIG. 13 is a circuit diagram for explaining the arrangement of a nonvolatile semiconductor memory according to the sixth embodiment of the present invention.

FIG. 13 shows the arrangement of a nonvolatile semiconductor memory according to the sixth embodiment of the present invention, which is also a modification of the embodiment shown in FIG. 1 or 4.

The number of word line switch circuits 3 may be set to be equal to the number of memory cell blocks 1a (1b), as shown in FIG. 13. If, for example, 512 memory cell blocks are arranged, 512 word line switch circuits are prepared. Alternatively, word line switch circuit 3 may be constituted by a multiplexer for sequentially connecting the output terminal of word line drive pulse generator 2 to 512 word lines in units of blocks.

Referring to FIG. 13, if all word line switch circuits 3a and 3b are simultaneously turned on to simultaneously connect all the word lines to the output terminal of word line drive pulse generator 2, the data in the memory cell transistors in all the memory cell blocks can be simultaneously erased (a batch erase operation of a flash EEPROM).

If word line switch circuits 3a to 3b are turned on each at a time to connect the output terminal of word line drive pulse generator 2 to each word line of a specific memory cell block, the data in all the memory cell transistors in each memory cell block can be erased in units of blocks (erase operation in units of blocks).

Figure 14:
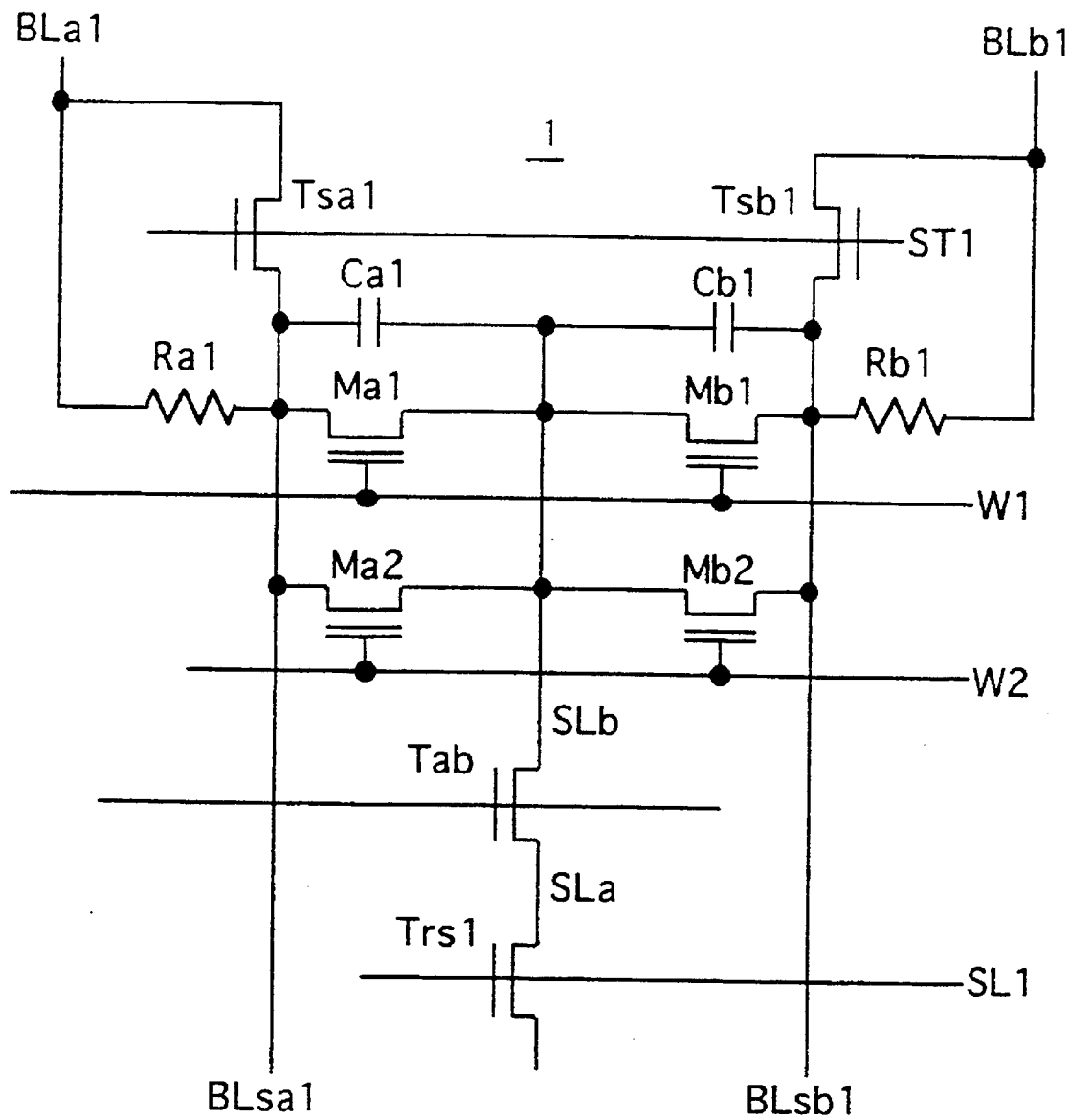
FIG. 14 is a circuit diagram for explaining the arrangement of a nonvolatile semiconductor memory according to the seven embodiment of the present invention.

The arrangement of the memory cell array can be further modified. For example, as shown in FIG. 14, if sub source line SLb is arranged in addition to source line SLa to which source-side selection transistor Trs1 is connected, a leakage current in the sub bit line can be compensated by connecting a compensation current supply circuit between the source line and the sub source line. More specifically, resistor-connected transistors Ta and Tb used in the embodiment shown in FIG. 8A are omitted, and their drain-source paths are short-circuited. The drain and source of third MOS transistor Tab are connected between source line SLa and sub source line SLb, and third MOS transistor Tab is turned on/off at the same timing as that of resistor-connected transistors Ta and Tb, thereby performing leakage current compensation. In this case, the above leakage current compensation can be performed only when selection transistor Trs1 of a source circuit (SLa/SLb) is turned on by a signal from gate line SL1.

In the foregoing explanation, the threshold voltage (Vth) of the memory cell transistors (Ma1, Mb1, . . . ), obtained after writing with the word line voltage (VW) of 3 V (=+peak potential of drive pulse WDP OUT), has been explained as 2.5 V. The value of the threshold voltage (Vth) can, of course, have various values other than 2.5 V. For instance, Vth=3.7 V can be used for the written data with VW=3 V, or Vth=3.0 V can be used for the written data with VW=2 V, or Vth=2.3 V can be used for the written data with VW=1 V.

As described above, according to the nonvolatile semiconductor memory of the present invention, the different floating gate voltages of many nonvolatile memory cell transistors can be caused to converge to a predetermined potential by applying a pulse oscillating between positive and negative voltages to the floating gate of each memory cell transistor after the sub bit line is precharged. That is, accurate write and erase operations can be performed with a very simple means.

Since the leakage current compensation means is arranged, the potential of the charge voltage stored on a sub bit line can be held even if the charge voltage of the sub bit line drops owing to a leakage current. At the held sub bit line potential, all the nonvolatile memory cell transistors having different floating gate voltages can be reliably set to a predetermined threshold voltage for an erase operation.

In addition, in the nonvolatile semiconductor memory of the present invention, a sub bit line to which the drains of a plurality of nonvolatile memory cell transistors constituting each memory cell block are connected can be caused to operate as a write information buffer similar to a DRAM function. Therefore, the time required to write information in each nonvolatile memory cell transistor can be shortened as in a DRAM.

What is claimed is:

1. A nonvolatile semiconductor memory comprising:

a main bit line;

a sub bit line;

a bit line selection transistor for selectively connecting said sub bit line to said main bit line;

operating means for intermittently turning on said bit line selection transistor after said sub bit line is connected to said main bit line by said bit line selection transistor;

a memory cell transistor having a floating gate for holding nonvolatile information, and a control gate for controlling writing, erasing, or reading of information held in said floating gate, said memory cell transistor being connected to said sub bit line; and drive signal means for supplying a drive signal to said control gate of said memory cell transistor, the drive signal alternately and repeatedly having a first potential and a second potential different from the first potential.

2. A nonvolatile semiconductor memory comprising:

main bit line;

a sub bit line having a capacitance component;

a bit line selection transistor for precharging the capacitance component of said sub bit line to a potential of said main bit line by selectively connecting said sub bit line to said main bit line;

a memory cell transistor, having a floating gate for holding nonvolatile information, and a control gate for controlling writing, erasing, or reading of information held in said floating gate, so that potential information precharged in the sub bit line is written in said floating gate; and a drive signal means for supplying a drive signal to said control gate of said memory cell transistor, the drive signal alternately and repeatedly having a first potential and a second potential different from the first potential.

3. A memory according to claim 2, further comprising:

a resistive element inserted between said sub bit line; and said main bit line and a resistive-element-connected transistor, connected in series with said resistive element, for causing a predetermined current to flow from said main bit line to said sub bit line.

4. A memory according to claim 2, further comprising a resistive element, connected between said sub bit line and said main bit line, for supplying a predetermined current from said main bit line to said sub bit line.

5. A memory according to claim 2, wherein said main bit line includes a plurality of main bit lines, said sub bit line includes a plurality of sub bit lines, and said memory cell transistor includes a plurality of memory cell transistors, and said memory further comprises:

a plurality of bit line selection transistors for selectively connecting said plurality of sub bit lines to said plurality of corresponding main bit lines; and drive signal means for simultaneously supplying a drive signal to said control gates of said memory cell transistors, the drive signal alternately and repeatedly having a first potential and a second potential different from the first potential.

6. A memory according to claim 2, wherein said main bit line includes a plurality of main bit lines, said sub bit line includes a plurality of sub bit lines, and said memory cell transistor includes a plurality of memory cell transistors, and said memory further comprises:

a plurality of bit line selection transistors for selectively connecting said plurality of sub bit lines to said plurality of corresponding main bit lines; and drive signal means for simultaneously supplying a drive signal to said control gate of at least one of said memory cell transistors which is connected to one of said plurality of sub bit lines, the drive signal alternately and repeatedly having a first potential and a second potential different from the first potential.

7. A memory according to claim 2, wherein said main bit line includes a plurality of main bit lines, said sub bit line includes a plurality of sub bit lines, and said memory cell transistor includes a plurality of memory cell transistors, and said memory further comprises drive signal means for sequentially supplying a drive signal to said control gates of said plurality of memory cell transistors, the drive signal alternately and repeatedly having a first potential and a second potential different from the first potential.

8. A nonvolatile semiconductor memory according to claim 2, wherein;

said memory cell transistor has a source and drain one of which is coupled to said sub bit line and the other of which is coupled to a predetermined circuit with a predetermined potential, and said memory further comprising:

means for setting said sub bit line in a floating state higher in potential than the predetermined circuit before applying said drive signal to the control gate of said memory cell transistor.

9. A nonvolatile semiconductor memory according to claim 8, said memory further comprising:

means for intermittently and instantaneously activating said setting means so that a small amount of charge is supplied to said sub bit line in the floating state in an interval during which said drive signal is applied to the control gate of said memory cell transistor.

10. A nonvolatile semiconductor memory comprising:

a main bit line;

a sub bit line having a capacitance component;

a bit line selection transistor for precharging the capacitance component of said sub bit line to a potential of said main bit line by selectively connecting said sub bit line to said main bit line;

a resistive element inserted between said sub bit line and said main bit line;

a resistive-element-connected transistor, connected in series with said resistive element, for causing a predetermined current to flow from said main bit line to said sub bit line via said resistive element during an ON period; and a memory cell transistor, having a floating gate for holding nonvolatile information, and a control gate for controlling writing, erasing, or reading of information held in said floating gate, so that potential information precharged in the sub bit line is written in said floating gate.

11. A memory according to claim 10, further comprising drive signal means for supplying a drive signal to said control gate of said memory cell transistor, the drive signal alternately and repeatedly having a first potential and a second potential different from the first potential.

12. A nonvolatile semiconductor memory comprising:

a plurality of main bit lines;

a plurality of sub bit lines;

a plurality of bit line selection transistors for selectively connecting said plurality of sub bit lines to said plurality of corresponding main bit lines;

at least one memory cell transistor having a floating gate for holding nonvolatile information, and a control gate for controlling writing, erasing, or reading of information held in said floating gate, each of said memory cell transistors being connected to a corresponding one of said sub bit lines; and drive signal means for supplying a drive signal to said control gates of said plurality of memory cell transistors, the drive signal alternately and repeatedly having a first potential and a second potential different from the first potential.

13. A nonvolatile semiconductor memory comprising:

a plurality of main bit lines;

a plurality of sub bit lines;

a plurality of bit line selection transistors for selectively connecting said plurality of sub bit lines to said plurality of corresponding main bit lines;

at least one memory cell transistor having a floating gate for holding nonvolatile information, and a control gate for controlling writing, erasing, or reading of information held in said floating gate, each of said memory cell transistors being connected to a corresponding one of said sub bit lines; and drive signal means for simultaneously supplying a drive signal to said control gate of at least one of said memory cell transistors which is connected to one of said plurality of sub bit lines, the drive signal alternately and repeatedly having a first potential and a second potential different from the first potential.

14. A nonvolatile semiconductor memory comprising:

a plurality of main bit lines;

a plurality of sub bit lines;

a plurality of bit line selection transistors for selectively connecting said plurality of sub bit lines to said plurality of corresponding main bit lines;

at least one memory cell transistor having a floating gate for holding nonvolatile information, and a control gate for controlling writing, erasing, or reading of information held in said floating gate, each of said memory cell transistors being connected to a corresponding one of said sub bit lines; and drive signal means for sequentially supplying a drive signal to said control gates of said plurality of memory cell transistors, the drive signal alternately and repeatedly having a first potential and a second potential different from the first potential.

15. A nonvolatile semiconductor memory comprising:

a main bit line;

a sub bit line having a capacitance component;

a bit line selection transistor for precharging the capacitance component of said sub bit line to a potential of said main bit line by selectively connecting said sub bit line to said main bit line;

a resistive element, inserted between said sub bit line and said main bit line, for supplying a predetermined current from said main bit line to said sub bit line;

a memory cell transistor having a floating gate for holding nonvolatile information, and a controlgate for controlling writing, erasing, or reading of information held in said floating gate, so that potential information precharged in the sub bit line is written in said floating gate; and a drive signal means for supplying a drive signal to said control gate of said memory cell transistor, the drive signal alternately and repeatedly having a first potential and a second potential different from the first potential.

16. A nonvolatile semiconductor memory according to claim 15, wherein;

said memory cell transistor has a source and drain one of which is coupled to said sub bit line and the other of which is coupled to a predetermined circuit with a predetermined potential, and said memory further comprising:

means for setting said sub bit line in a floating state higher in potential than the predetermined circuit before applying said drive signal to the control gate of said memory cell transistor.

17. A nonvolatile semiconductor memory according to claim 16, said memory further comprising: means for intermittently and instantaneously activating said setting means so that a small amount of charge is supplied to said sub bit line in the floating state in an interval during which said drive signal is applied to the control gate of said memory cell transistor.

* * * * *

UNITED STATES PATENT AND TRADEMARK OFFICE
CERTIFICATE OF CORRECTION

PATENT NO. : 5,623,444
DATED : April 22, 1997
INVENTOR(S) : Hiroshi Gotou et al.

It is certified that error appears in the above-identified patent and that said Letters Patent is hereby corrected as shown below:

On the title page, item [73], insert

--NKK Corporation--.

Signed and Sealed this

Twentieth Day of October, 1998

Attest:

BRUCE LEHMAN

*Attesting Officer*     *Commissioner of Patents and Trademarks*